(12) United States Patent
Herbst et al.

(10) Patent No.: US 6,845,779 B2
(45) Date of Patent: Jan. 25, 2005

(54) EDGE GRIPPING DEVICE FOR HANDLING A SET OF SEMICONDUCTOR WAFERS IN AN IMMERSION PROCESSING SYSTEM

(75) Inventors: Tim W. Herbst, Minneapolis, MN (US); Todd K. Maciej, Little Falls, MN (US); Tracy A. Gast, Waconia, MN (US); Thomas J. Wagener, Shorewood, MN (US); Kevin L. Siefering, Excelsior, MN (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 10/292,807

(22) Filed: Nov. 11, 2002

(65) Prior Publication Data

US 2003/0098047 A1 May 29, 2003

Related U.S. Application Data

(60) Provisional application No. 60/338,044, filed on Nov. 13, 2001.

(51) Int. Cl.[7] .............................. B08B 9/20; B65D 85/30
(52) U.S. Cl. ..................... 134/25.4; 134/133; 134/165; 134/902; 118/503; 206/711
(58) Field of Search .............................. 134/1, 1.1, 18, 134/2, 25.4, 26, 30, 56, 58, 38, 19, 402, 133, 165, 201; 15/77; 118/728, 500, 503; 206/711; 414/404

(56) References Cited

U.S. PATENT DOCUMENTS

| | | | | |
|---|---|---|---|---|
| 4,566,839 A | * | 1/1986 | Butler | ......................... 414/404 |
| 4,653,636 A | * | 3/1987 | Armstrong | .................. 206/711 |
| 5,271,774 A | | 12/1993 | Leenaars et al. | |
| 5,555,981 A | | 9/1996 | Gregerson | |
| 5,749,467 A | | 5/1998 | Gregerson | |
| 5,858,103 A | * | 1/1999 | Nakajima et al. | ........... 118/728 |
| 5,931,721 A | | 8/1999 | Rose et al. | |
| 5,967,156 A | | 10/1999 | Rose et al. | |
| 6,041,938 A | | 3/2000 | Senn | |
| 6,098,643 A | | 8/2000 | Miranda | |
| 6,148,833 A | | 11/2000 | Tang et al. | |
| 6,153,533 A | | 11/2000 | Senn | |
| 6,171,403 B1 | | 1/2001 | Kamikawa et al. | |
| 6,203,406 B1 | | 3/2001 | Rose et al. | |
| 6,220,259 B1 | | 4/2001 | Brown et al. | |
| 6,256,555 B1 | | 7/2001 | Bacchi et al. | |
| 6,264,036 B1 | | 7/2001 | Mimken et al. | |
| 6,269,511 B1 | * | 8/2001 | Andreas et al. | ................. 15/77 |
| 6,286,688 B1 | | 9/2001 | Mimken et al. | |

FOREIGN PATENT DOCUMENTS

EP        1 049 139        11/2000

OTHER PUBLICATIONS

PCT International Search Report, PCT/US02/36168 (3 pages), Apr. 22, 2003.

* cited by examiner

Primary Examiner—Frankie L. Stinson
Assistant Examiner—Joseph L. Perrin
(74) Attorney, Agent, or Firm—Kagan Binder, PLLC

(57) ABSTRACT

A microelectronic substrate handling device comprising first and second support structures spaced from each other, the first support structure having a series of upper teeth defining a series of upper notches extending along a length of the first support structure and a series of lower teeth defining a series of lower notches extending along a length of the first support structure, each of the upper and lower notches opening toward the second support structure, wherein the upper and lower notches are offset from each other by a predetermined offset distance so that an edge of a microelectronic device will fit differently within the upper and lower notches of the first support structure when supported between the first and second support structures.

26 Claims, 14 Drawing Sheets

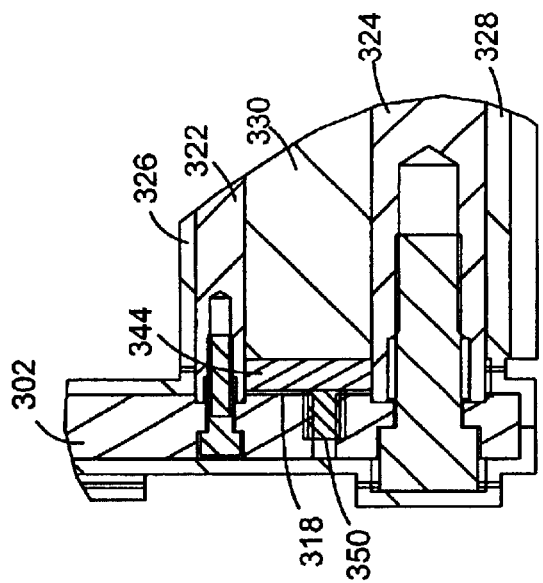
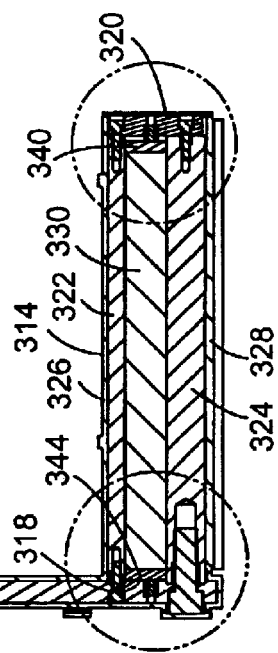
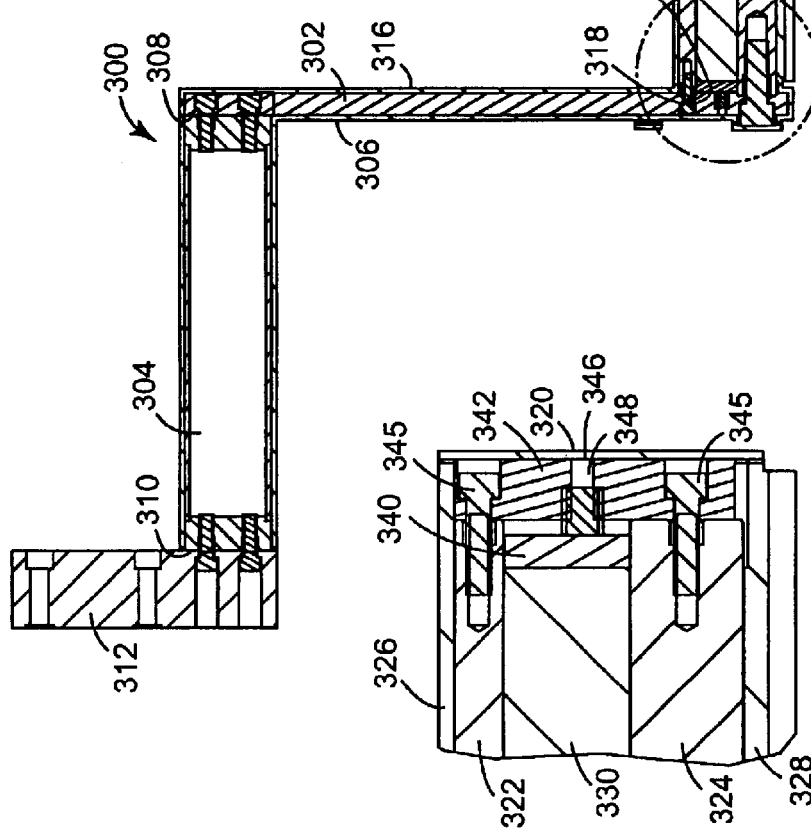
Fig. 16
Fig. 14
Fig. 15

EDGE GRIPPING DEVICE FOR HANDLING A SET OF SEMICONDUCTOR WAFERS IN AN IMMERSION PROCESSING SYSTEM

PRIORITY CLAIM

This patent application claims priority from U.S. Provisional Patent Application No. 60/338,044, filed Nov. 13, 2001, under 35 U.S.C. §119(e), commonly owned by the assignee of the present application, the entire contents of which are incorporated herein by reference.

TECHNICAL FIELD

The present invention relates to wafer support systems that are useful for supporting and handling wafers, such as semiconductor wafers, during various wet processing, cleaning and drying operations. More particularly, the present invention relates to edge supporting devices for transferring materials in an immersion processing system.

BACKGROUND OF THE INVENTION

Semiconductor wafers are commonly used to produce integrated circuits and other microelectronic devices. These wafers are typically disks made of fragile materials that are relatively thin as compared to their surface areas. For example, a 300 mm diameter silicon wafer can be approximately 0.775 mm thick. These wafers are often subjected to several processing steps during the manufacturing of microelectronic devices, during which it is important both to keep the wafer extremely clean and to protect the wafer surfaces from being scratched, broken, or otherwise damaged.

Many of the steps involved in semiconductor wafer processing include placing a wafer or group of wafers in a fluid processing tank where the wafers are exposed or subjected to various processing solutions to achieve particular results, such as chemical etching of wafer surfaces. Common processing fluids that are used include acidic solutions, basic solutions, and highly oxidative solutions. After each processing step, any contaminants and/or processing fluids remaining on the surface of the wafer are typically rinsed in a separate rinsing step to prepare the wafer for further processing or as a final step in the processing of the wafer. The processing and rinsing solutions may be sequentially applied in the same processing tank in a process where the wafers are placed in a tank to which fluids are added then drained for each sequential treating and rinsing operation. Alternatively, wafers may be transferred from one processing tank to another, where the different solutions can be sequentially applied to the wafers in the different processing tanks. An additional processing step that may be required between subsequent processing steps (such as after a rinsing process) is referred to as a drying step, in which any droplets or films that remain on a wafer surface are removed from that surface with equipment such as an isopropyl alcohol (IPA) vapor dryer. This additional drying step can be particularly beneficial to remove droplets containing contaminant particles before those particles are deposited on a wafer surface due to evaporation of that droplet.

When processing a group or set of wafers, it is important that each wafer be sufficiently spaced from adjacent wafers to allow an adequate flow of the various processing and rinsing solutions, thereby allowing for uniform surface treatments to reach all surfaces of each wafer. In addition, it is important that each wafer be held as close to its outer perimeter as possible throughout the various processing and rinsing steps in order to provide the processing and rinsing fluids with unobstructed access to the critical surfaces of each wafer. In fact, current wafer processing guidelines allow for handling only the outer 3 mm of each wafer, which is considered to be the unusable portion of the wafer and may also be referred to as the exclusion zone of the wafer. To provide additional usable area of each wafer, it may be desirable to handle each wafer even closer to its edges, such as the outer 1 mm of each wafer, for example.

The two basic techniques commonly used for holding wafers throughout multiple processing steps include systems with wafer supports or cassettes and systems that do not use cassettes. One example of a commonly used cassette-based system is illustrated schematically in FIG. 1, in which a group of semiconductor wafers is being cleaned using a fluid and megasonic energy. This cleaning system 10 includes a tank 12 containing a wafer or group of semiconductor wafers 14, where the group of wafers 14 is supported by wafer supports 16. In this example, the group of wafers 14 is supported by four wafer supports 16 that are either part of a cassette that moves along with its group of wafers 14 between multiple tanks for various processing operations or part of a wafer support system that remains in the tank when the wafers are withdrawn using a tank-to-tank robot or other wafer removal device.

In wafer processing systems that do not use cassettes, multiple wafers are typically moved and held as a group by more than one type of mechanism, where the mechanisms do not remain with a particular group of wafers for more than one step of the process. For example, a group of wafers can be transferred from one processing tank area to another processing tank area by a tank-to-tank robot, and separate elevator robots can then remove the wafers from the tank-to-tank robot and lower them into a processing tank. These elevator robots can support the wafers in the same general manner as that described above for supporting wafers during both the transportation of wafers and the processing of wafers within each tank. That is, the wafers in this type of configuration can rest on wafer supports that are arranged similarly to the wafer supports 16 of FIG. 1 and that are located along the bottom edge of the wafers. The wafer supports used in any of these arrangements may be provided with grooves or teeth between which the wafers can rest; however, the wafers are not actively held in place by any movable mechanisms.

In either of the system types described above, it is common to treat the wafers both with the addition of fluid to the tank and with the application of additional energy to the system to further assist in the removal of undesirable contaminants from the surfaces of the wafers. Referring again to FIG. 1, a megasonic transducer array 18 is used to introduce megasonic energy from the bottom of the tank 12. Because this energy comes from the bottom of the tank, the energy that comes from directly beneath the wafer supports 16 will be distorted as it moves upward and meets the wafer supports 16. Thus, the areas that are directly above the wafer supports 16 will be exposed to less of the megasonic energy than the remainder of the wafer, thereby lessening the effectiveness of the wafer cleaning in these areas. These areas may be referred to as "shadow" areas of the wafers, which can sometimes result in unusable areas of wafers or entire unusable wafers because they contain more than an allowable amount of contamination. Shadow areas can be reduced or eliminated with various techniques, such as, for example, applying a larger amount of megasonic energy to the wafers or applying megasonic energy from multiple sources. However, these more complicated and timeconsuming techniques tend to reduce the efficiency and cost-effectiveness of the process and can result in damage to fragile wafer features or components due to overexposure to megasonic energy. Ideally, therefore, the entire wafer is exposed to a relatively equal amount of megasonic energy in only a sufficient amount to achieve the desired cleaning action.

One example of a cassette-based system that can be used to minimize the obstruction of megasonic energy that reaches the wafer is disclosed in U.S. Pat. No. 6,264,036 (Mimken et al.). The cassette of this patent is formed from two substantially parallel rods, each rod having notches spaced from one another for receiving objects to be carried. The cassette further includes a pair of supporting members extending between the rods, which are spaced apart so that substantially planar objects will fit between the rods and rest in their notches. Because the cassette is designed so that each side of a wafer positioned between the rods contacts each side of the cassette at one point that is approximately at the centerline of the wafer and at another point that is spaced slightly below the centerline, the wafer is basically primarily being held in place by gravity at the two points below the centerline on either side of the wafer. As described above, this cassette is designed to hold wafers as they travel throughout various processing steps, with the added advantage of limited obstruction of the megasonic energy that reaches the faces of the disk.

While the above described cassette can be advantageous to provide better fluid access to the disk surfaces, as the number of points that the wafer contacts a supporting surface decreases, the tendency of the wafers to tip toward and away from adjacent wafers increases. In particular, a cassette system with only two contact rods that are positioned relatively high on the wafer would typically be a less stable system than the system of FIG. 1 which includes four contact rods that are positioned much closer to the bottom of the wafer. In general, cassette-based systems can be disadvantageous because fluid from one tank can be carried on the cassette to another tank, which can thereby contaminate the fluid of the later tank. Thus, it is desirable to provide a system for holding wafers that minimizes obstruction of the wafer surfaces while keeping the disks relatively stable with respect to one another and the surrounding structure, and also minimizes fluid carry-over by moving the wafers without a cassette.

SUMMARY OF THE INVENTION

In one aspect of this invention, a microelectronic substrate handling device is provided for immersion processing at least one microelectronic substrate. The device comprises first and second support structures extending from a support plate and operatively spaced from each other to support at least one microelectronic substrate, the first support structure having a series of upper teeth defining a series of upper notches extending along a length of the first support structure, each of the upper notches opening toward the second support structure for receiving an edge of a microelectronic device when supported by the first and second support structures. The first support structure further includes a series of lower teeth defining a series of lower notches extending along a length of the first support structure, each of the lower notches opening toward the second support structure for receiving an edge of a microelectronic device when supported by the first and second support structures. The upper and lower notches are preferably offset from each other by a first predetermined offset distance so that an edge of a microelectronic device will fit differently within the upper and lower notches of the first support structure when supported between the first and second support structures.

The second support structure of the microelectronic substrate handling may further comprise a series of upper teeth defining a series of upper notches extending along a length of the second support structure, each of the upper notches opening toward the first support structure for receiving an edge of a microelectronic device when supported by the first and second support structures and a series of lower teeth defining a series of lower notches extending along a length of the second support structure, each of the lower notches opening toward the first support structure for receiving an edge of a microelectronic device when supported by the first and second support structures.

In the microelectronic substrate handling device, the upper and lower notches may be offset from each other by a second predetermined offset distance so that an edge of a microelectronic device will fit differently within the upper and lower notches of the second support structure when supported between the first and second support structures.

BRIEF DESCRIPTION OF THE DRAWINGS

The present invention will be further explained with reference to the appended Figures, wherein:

FIG. 14 is a cross-sectional view of an elevator device of the present invention, illustrating the construction of the structure;

FIGS. 15 and 16 are enlarged views of the portions of FIG. 14 that are encircled by dashed lines, showing the structure that stabilizes the support bar of the elevator.

DETAILED DESCRIPTION OF THE PREFERRED EMBODIMENTS

Figure 1:
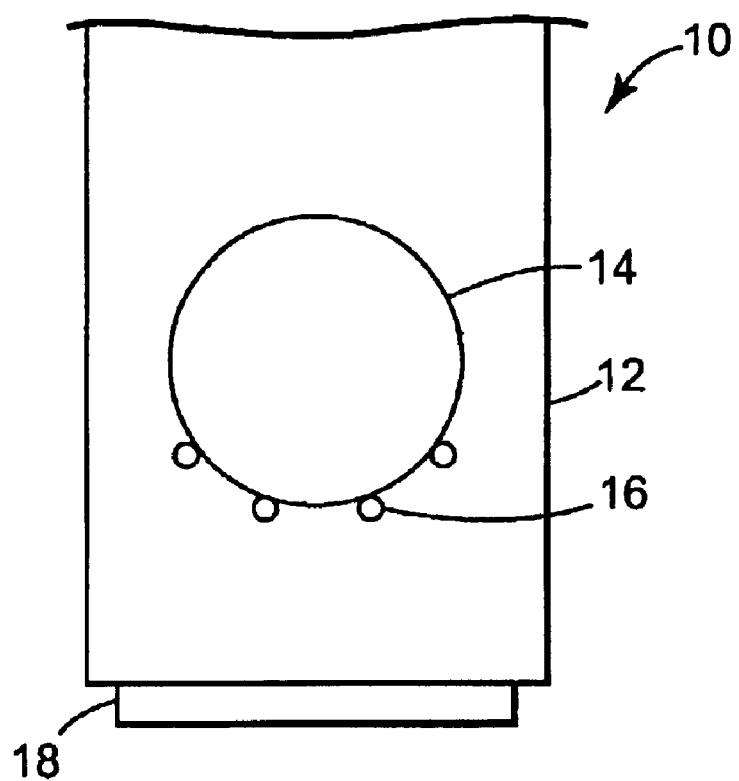
FIG. 1 is a front schematic view of a prior art system of cleaning semiconductor wafers.
Figure 2:
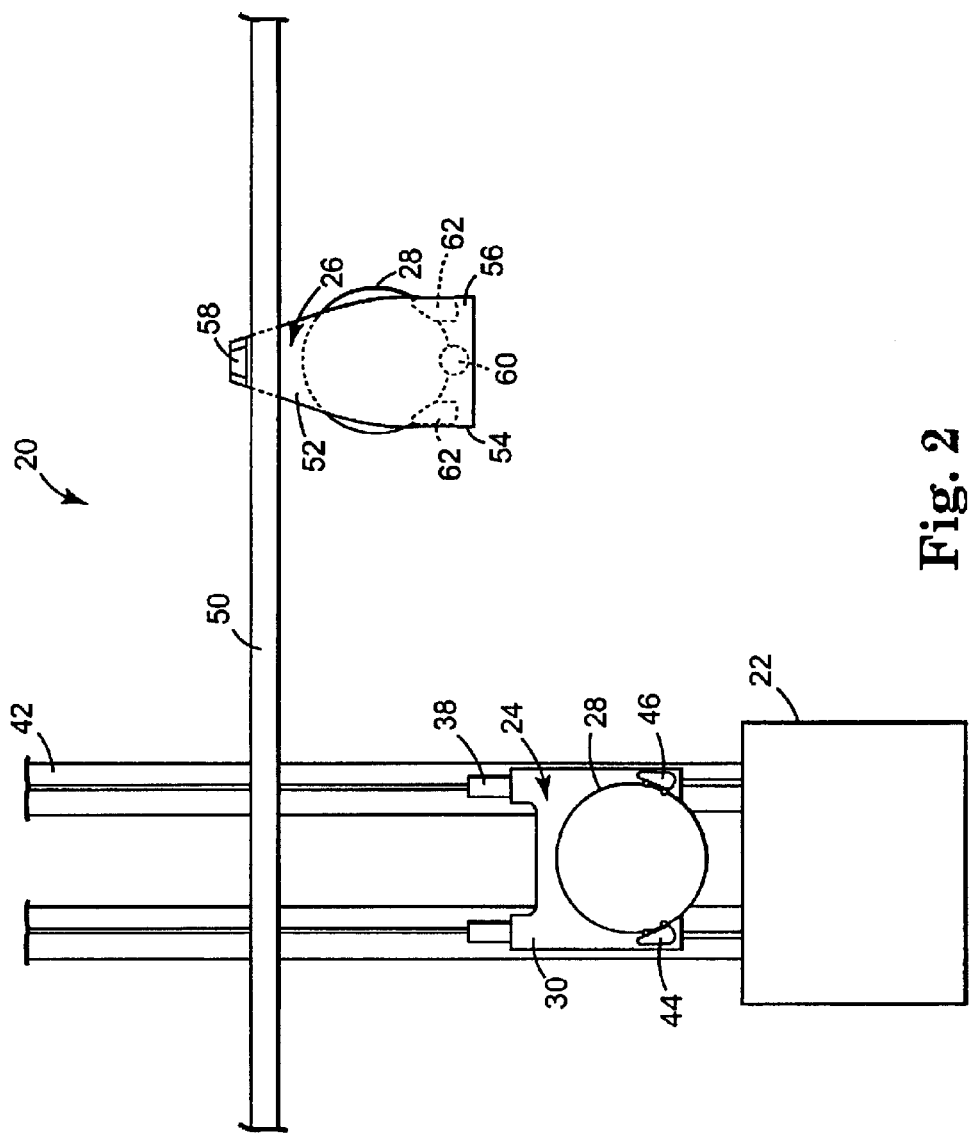
FIG. 2 is a schematic side view of an immersion processing system in accordance with the present invention including an elevator having support rods with multiple support rows of teeth, a processing tank, and a transfer robot.

Referring now to the Figures, wherein the components are labeled with like numerals throughout, and initially to the schematic illustration of FIG. 2, one embodiment of a wafer handling system 20 is illustrated in accordance with the present invention. Wafer handling system 20 generally comprises a processing tank 22, an elevator 24 for moving wafers 28 into and out of tank 22, and a transfer robot 26 for transferring wafers between the area of tank 22 and another location, such as another processing tank or piece of wafer processing equipment.

A wafer or group of wafers 28 of the present invention may include any substrate or object having first and second major, generally oppositely facing surfaces. Wafers may comprise semiconductor materials, such as silicon and gallium arsenide, insulator materials, such as sapphire, quartz, and glass, metallic materials, such as copper, or combinations thereof, such as silicon-gallium arsenide hybrid substrates. Wafers may also include substrates for hybrid microelectronics manufacture such those formed from ceramics or the like. In addition, wafers may include microelectronic devices that are partially or fully formed thereon, or may be previously unprocessed wafers. Microelectronic devices can comprise, for example, devices utilized for forming flat-panel displays, micro-electrical-mechanical-systems (MEMS) devices, electrical interconnect devices and systems, optical components, components of mass storage devices, and the like.

The wafer handling system of the present invention may be used to process single wafers; however, the system can advantageously be used to process a plurality of wafers that are supported or transported together for contemporaneous treatment in one or more of various stages of a wafer processing system. Certain wafers, such as semiconductor wafers (or substrates), may be delivered to a wafer processing system together in a transfer device such as a FOUP, or "front opening unified pod." The wafers are preferably processed in sets of twenty-five, fifty or fifty-two wafers; however, the principles of the present invention may advantageously be applied to any number of wafers. A set of wafers may be transferred from a FOUP to a different carrying device for processing in a wafer processing system. Thus, the wafers handled by the wafer handling system of the present invention are usually described below as a set or plurality of wafers, with the understanding that the same principles may be applied to a single wafer.

The processing tank 22 is preferably an immersion-type vessel that is sized to accommodate a plurality of wafers that are held therein for a particular processing steps. As illustrated, processing tank 22 is generally rectangular in shape for accommodating a particular set of wafers 28, but may be shaped and sized differently to accommodate differently shaped and sized wafers. In any case, the size of the tank is preferably designed to accommodate the volume of a processing liquid required to cover a set of wafers 28 that are immersed therein, and to accommodate the thickness of a set of wafers and the fluid flow requirements needed to permit sufficient processing liquid to flow between the adjacent wafers and between the outermost surfaces of the set of wafers and the surrounding tank walls. To minimize the tank volume and the corresponding amount of fluid needed to fill the tank, the wafers are preferably spaced to be very close to each other during processing, such as a 5 mm space between adjacent 300 mm wafers, for example. Due to the fact that these wafers are so close to each other and the presence of surface tension forces between wafers when liquid is in the tank, it is important that the wafers can be consistently positioned and held rigidly in place throughout the various processing and wafer transfer operations.

Figure 3:
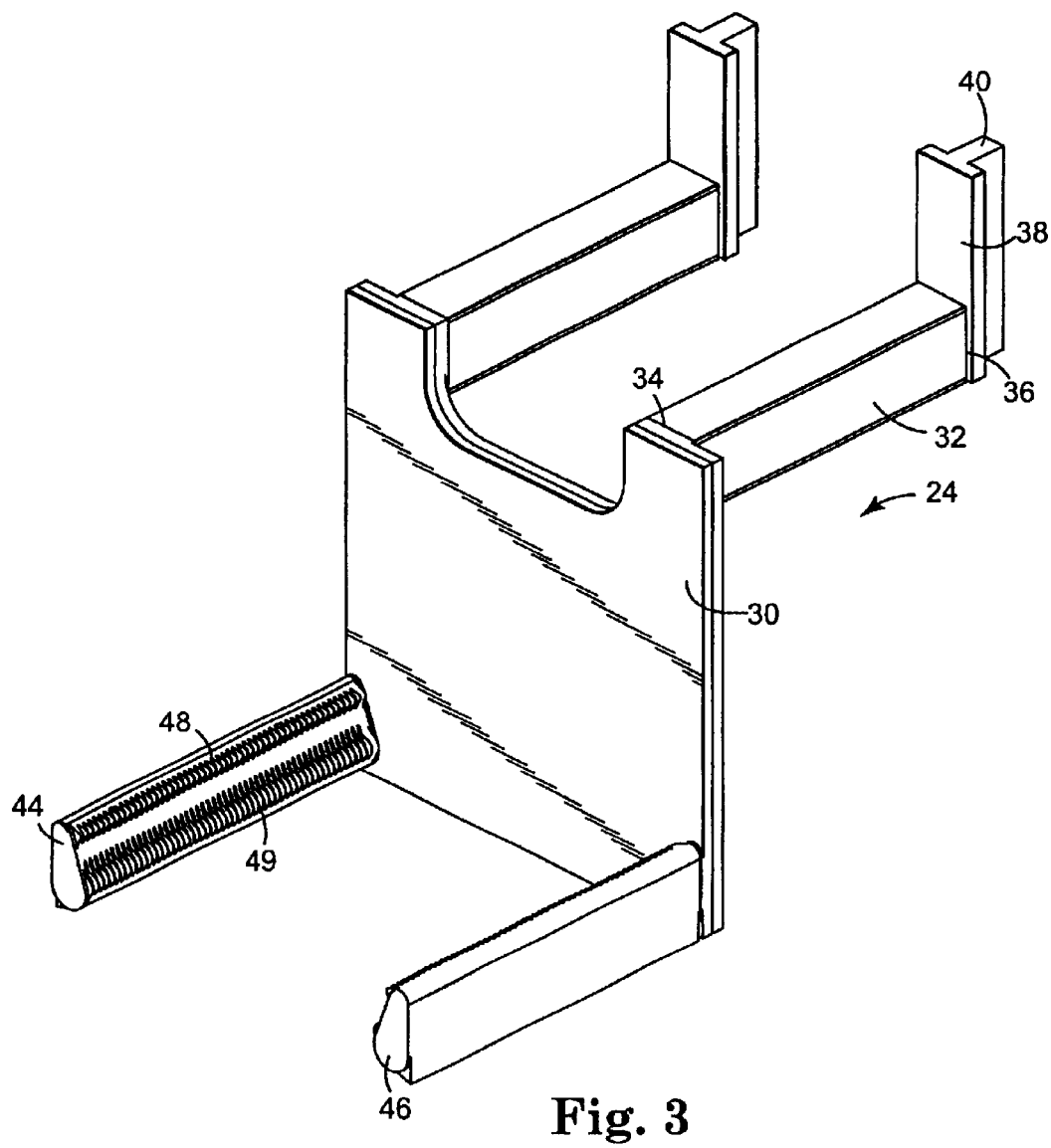
FIG. 3 is a perspective view of an elevator having two wafer support rods for holding and immersing wafers in a processing tank in accordance with the present invention.

Referring also to FIG. 3, elevator 24 comprises a support plate 30 from which two mechanically rigid support beams 32 extend. Each support beam 32 is preferably mounted to be substantially perpendicular to the face of support plate 30, with a first end 34 adjacent to the backside of plate 30, and a second, distal end 36 of support beam 32 connected to a bracket 38. Support beams 32 may be attached to support plate 30 and bracket 38 by any conventional attachment methods, such as by welding or mechanical attachment devices, or the three parts may instead be manufactured and/or machined from a single piece of material. In one preferred configuration of bracket 38 having a generally T-shaped cross-section, a slide portion 40 is designed to cooperate with a guide track 42 (see FIG. 2) to allow movements of elevator 24 in a vertical direction. It is understood that any conventionally known or later developed guide and slide mechanism can be utilized for translating and guiding the elevator 24 along guide track 42. In addition, it is contemplated that any conventional or developed drive mechanism (not shown) can be incorporated within such a guide and slide mechanism for driving elevator 24 along guide track 42. For example, a rack can be mounted along the guide track 42 so that a drive can be conventionally rotatably mounted to support plate 30 and driven so that support plate 30 can move vertically along the track. Alternatively, pneumatic or hydraulic cylinders may provide movement of support plate 30, the degree of movement defined by the stroke of such cylinders. Other electrical, hydraulic, pneumatic, and mechanical drive mechanisms are contemplated for moving support plate 30 and for providing a drive force to any driven component.

Elevator 24 preferably further comprises a first wafer support rod 44 extending in a generally perpendicular direction from the front face of support plate 30, and a second wafer support rod 46 that also extends in a generally perpendicular direction from the front face of support plate 30 in a direction that is substantially parallel to first wafer support rod 44. Support rods 44, 46 may be attached to support plate 30 in any conventional manner, such as by welding, fasteners, or the like. However, it is advantageous for these rods 44, 46 to be rigidly attached to support plate 30 in order to minimize undesirable movements of rods 44, 46 relative to support plate 30, particularly when wafers are supported thereon. Support rods 44, 46 may either be permanently attached to support plate 30, or may be removably attached so that a single elevator 24 may be used with various interchangeable support rods, as desired. Alternatively, rods 44, 46 may be movable, preferably in a controlled manner, relative to support plate 30. For example, the rods 44, 46 may be moved by a swing-away motion generally in the x-direction lateral to the position of any wafers 28.

Support rods 44, 46 are preferably designed to accommodate a particular number of wafers that would typically be processed with a particular elevator 24. For example, if a set of fifty wafers is being processed together, support rods 44, 46 should be long enough to effectively handle fifty or more wafers spaced from each other for processing. However, it is possible for a small number of wafers to be held by support rods that could accommodate a larger number of wafers.

Support rods 44, 46 preferably each include an upper support row 48 and a lower support row 49, which each preferably include a plurality of notches that will be discussed in further detail below. It is understood, however, that a support rod may include more or less than two support rows. In any case, support rods 44, 46 are preferably spaced from each other so that substantially planar objects, such as wafers, will fit between the rods 44, 46 and rest within the notches. In addition, support rods 44, 46 are preferably positioned so that they will have minimal or no effects on bottom mounted correctional processing techniques, such as utilizing bottom-mounted megasonic transducers. Thus, support rods 44, 46 are preferably spaced far enough from each other that their uppermost support rows contact the wafers 28 resting between the rods at points that are as close as possible to the horizontal centerline of those wafers (i.e., as close to the 3 o'clock and 9 o'clock positions as possible), while preferably being slightly below the centerline of the wafers. Preferably, the support rods are placed such that their contact points with the wafers are within about 10 degrees from the wafer centerline. More preferably, any shadowing effect that may occur from megasonic energy introduced below the wafers is limited by designing and positioning the support rods to minimize their overlap in a vertical sense with the energy from a megasonic transducer, for example. In other words, at least a portion of support rods 44, 46 are preferably nearly diametrically opposed relative to the wafers 28. In one preferred embodiment, support rods 44, 46 are each located at approximately 63 degrees from the 6 o'clock position with respect to the center of a wafer held between the support rods. However, this angle may be larger or smaller than 63 degrees, depending on the requirements of each particular system. Due to this positioning (i.e., support rods 44, 46 beneath the wafer), the wafers will be supported on the support rods 44, 46 by gravity. Thus, the support rods 44, 46 should not be spaced so far from each other that the wafers could slip downwardly between the rods. In addition, the distance between rods 44, 46 should be chosen to accommodate wafers that are at the lowest end of the tolerance range for a particular nominal wafer diameter (i.e., the smallest wafers that have an acceptable diameter according to the allowable manufacturing tolerances). Finally, in one preferred embodiment, support rods 44, 46 should be spaced far enough from each other that their inner surfaces pass by or around support rods of transfer robot 26, as further described below.

Transfer robot 26 is illustrated in FIG. 2 as positioned along a horizontal guide track 50, where robot 26 is horizontally positioned so that it is not above processing tank 22. As shown, transfer robot 26 could be transporting a set of wafers 28 toward processing tank 22, or it may be carrying a set of wafers 28 that have recently been processed in tank 22 away from that tank and toward another processing station, such as another immersion tank or another type of station in the manufacturing process.

As shown, transfer robot 26 comprises a support plate 52 having a first face 54 and an opposite second face 56. An exemplary bracket 58 is illustrated as extending from the second face 56 of support plate 52. Bracket 58 preferably includes a slide element (not shown) that cooperates with the guide track 50 to allow horizontal sliding movements of transfer robot 26 along guide track 50. As discussed above relative to guide track 42, it is understood that any conventionally known or later developed guide and slide mechanisms can be used for horizontal sliding movements of bracket 58 along guide track 50. In addition, any conventional or developed drive mechanism can be incorporated within such a guide and slide system for driving bracket 58 along guide track 50. Guide track 50 may be similar in design to guide track 42, such that an extending portion of bracket 58 rides along a guide portion of guide track 50 (not shown). Alternatively, guide track 50 may have a different construction and/or drive from that of guide track 42. Any electrical, hydraulic, pneumatic, and mechanical drive mechanisms can be used for moving transfer robot 26, such as those suggested above for guide track 42, and for providing a drive force to any driven component.

Figure 4:
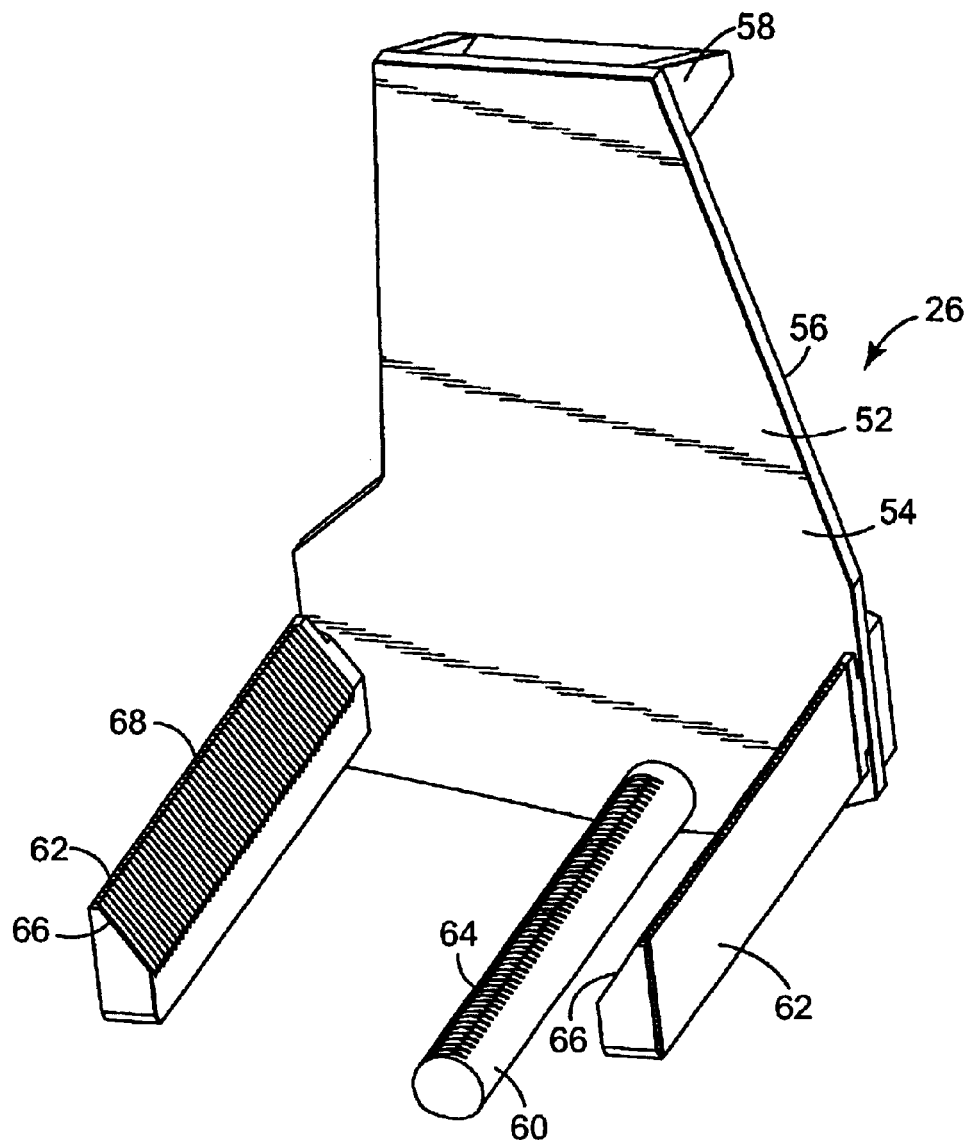
FIG. 4 is a perspective view of a transfer robot for transferring wafers to and from processing areas in accordance with the present invention.

Also referring now to FIG. 4, transfer robot 26 is shown in a generally opposite orientation to that illustrated in FIG. 2 in order to better view the various aspects of the robot. Transfer robot 26 further includes a lower positioning or positioning bar 60 and a pair of angled support bars 62. The bars 60, 62 preferably extend in a generally perpendicular direction from the first face 54 of support plate 52, and the bars 60, 62 are also preferably substantially parallel to each other. Bars 60, 62 may be attached to support plate 52 by any conventional method, such as by welding, fasteners, or the like. However, it is advantageous for the bars 60, 62 to be rigidly attached to support plate 52 in order to minimize undesirable movements of bars 60, 62 relative to support plate 52. Bars 60, 62 may either be permanently attached to support plate 52, or may be removably attached so that any or all of the bars may be removed and replaced, as desired. Alternatively, bars 60, 62 may be movable, preferably in a controlled manner, relative to support plate 50. As with the support rods of the elevator 24, the bars 60, 62 are preferably designed to accommodate at least the particular number of wafers that would typically be processed together. In addition, bars 60, 62 should preferably be designed to effectively handle at least the same number of wafers that a corresponding elevator 24 is designed to handle for processing. It is understood that the support rods of the elevator and the support and positioning bars of the transfer robot can be designed to handle the same or a different number of wafers, but it is preferable that both the elevator and the transfer robot can both accommodate at least the number of wafers that are to be processed.

As shown, positioning bar 60 has a circular cross-section and includes a plurality of grooves 64 along a portion of its upward-facing surface, which is the surface that typically will contact the wafers. Each groove 64 is preferably spaced from each adjacent groove by generally the same distance that wafers are desirably spaced from one another. In this way, the grooves 64 serve to assist in proper positioning of wafers in the direction in which positioning bar 60 extends (i.e., along the length of bar 60), so that the wafers are held relatively stable within the transfer robot and are prevented from tipping and contacting adjacent wafers. At the same time, it is desirable that each groove 64 be designed to minimize the contact between the wafer surfaces and groove surfaces, thereby minimizing marks on the wafer surfaces. The grooves 64 are thus preferably designed to be deep enough that a wafer resting therein does not "bottom out" or rest on the faces of the groove. Rather, because the primary intention of the grooves 64 is for positioning the wafers relative to each other along the length of bar 60, the wafer may contact the flanks of the grooves 64 without actually being supported by the grooves. Other configurations of the positioning bar 60 are also contemplated by the present invention, such as a bar that is made of a compliant material that can help to position the wafers relative to each other, for example.

Support bars 62 of transfer robot 26 are essentially mirror images of each other, with each bar 62 including a generally planar face 66 that is angled partially upwardly and partially facing toward the other bar 62. Each of the faces 66 includes a plurality of grooves 68 that are generally configured to also sufficiently support a wafer resting therein, while minimizing the amount of contact between the grooves and the wafer surfaces. In one preferred embodiment, the grooves 64 of positioning bar 60 are aligned with the grooves of support bars 62, so that wafers that are being transported by the robot 26 can be supported and/or positioned by the grooves of all three bars 60, 62 simultaneously. Positioning bars 62 are preferably spaced at an appropriate distance from each other to provide sufficient positioning of wafers relative to each other, where wafers that rest thereon are supported primarily by gravity and "cradled" by the support bars 62 and positioned relative to each other by the spacing between grooves and prevented from tipping by positioning bar 60. In other words, it is beneficial for at least two support bars, such as support bars 62, to be circumferentially located partially up the sides of the wafers, such as at approximately 55 degrees from the 6 o'clock position with respect to the center of a wafer resting between them, for example. In other words, the support bars 62 could be located at approximately the 4 o'clock and 8 o'clock positions in this embodiment. In addition, bar 60 is located at approximately 10 degrees from the 6 o'clock position in this embodiment. It is understood, however, that these bars 60, 62 may be located in many different positions relative to each other and relative to the center of the wafers to achieve the benefits of the present invention. For example, the bars 60, 62 may support wafers at symmetric locations about the bottom point of the wafers, or may be otherwise positioned. As will be described in further detail below, the bars 60, 62 are preferably spaced close enough to each other that they can pass without interference between the support rods of elevator 24.

While the above description sets out three support bars 60, 62, transfer robot 26 may include more or less than three such extending elements. In addition, the positioning and support bars 60, 62 may be configured in a number of different ways from that shown and described in order to accommodate differently sized or shaped components, or as preferred for a particular configuration. For example, positioning bar 60 may have a different cross-section than circular, and support bars 62 may have curvilinear or other shaped surfaces, or may instead be circular or have a different cross-section. In any case, the various support bars should adequately support any wafers and/or components so that they are sufficiently stable and protected from damage during movements of transfer robot 26.

In operation, any conventional manner may be used to provide a set of semiconductor wafers 28 to transfer robot 26. As illustrated in FIG. 2, a set of wafers 28 (shown partially in phantom) guided or positioned by bar 60 and supported by angled faces 66 of support bars 62, and, in particular, by the grooved surfaces of those bars. Transfer robot is typically horizontally located so that it is not above the tank 22 when it receives its set of wafers 28. At this point, elevator 24 is preferably positioned above tank 22 and below horizontal guide track 50. Although it is preferable that elevator 26 is not holding any wafers 28 before accepting a transfer of wafers from a transfer robot 26, elevator 24 should at least be sufficiently empty that it can accept the number of wafers 28 being transported for transfer by robot 26. Transfer robot 26 then slides horizontally along guide rail 50 until it is positioned above processing tank 22. At this point, the elevator 24 is positioned directly above tank 22 and below transfer robot 26.

Figure 5:
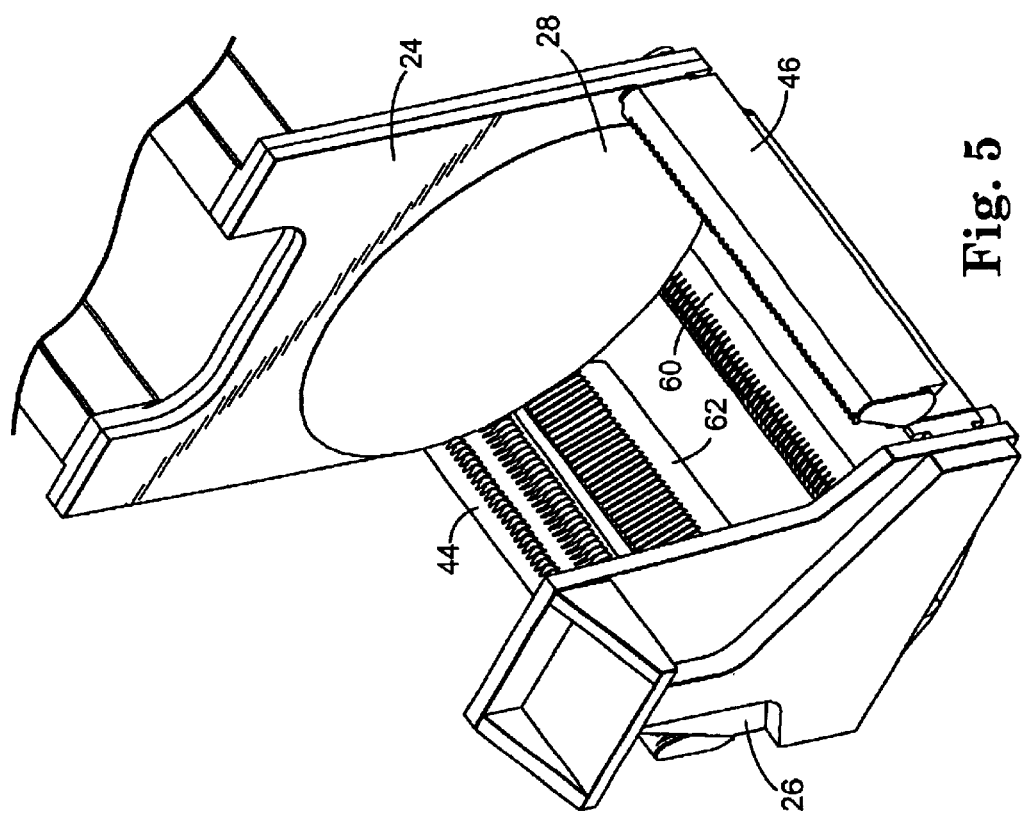
FIG. 5 is a perspective view of the elevator of FIG. 3 and the transfer robot of FIG. 4 holding a single wafer at the point when the wafer is being transferred between the elevator and transfer robot.

Elevator 24 then moves vertically upward until the wafer support rods 44, 46 come in contact with the wafers 28 being held by transfer robot 26. FIG. 5 illustrates this situation, with only a single wafer 28 being shown in order to more clearly view the various components. In particular, FIG. 5 illustrates the point at which the wafer support rods 44, 46 are beginning to lift wafer 28 from bars 60, 62 on which the wafer was being supported, positioned, and transported. As briefly mentioned above with regard to the various support bars and support rods of the present invention, the bars 60, 62 of transfer robot 26 should be spaced from each other so that the outermost bars (i.e., support bars 62, in this embodiment) are close enough to each other that the innermost surfaces of the wafer support rods 44, 46 of elevator 24 can pass around the bars 62 without interference. Thus, support rods 44, 46 essentially pass by the outer surfaces of support rods 62 as elevator 24 continues to move vertically upward. At this point, the outermost surfaces of wafers 28 are being supported by the support rows 48, 49 of rods 44, 46. The elevator 24 then continues to move vertically up guide track 42 until the lowermost portion of elevator 24 including wafers 28 (which is the lowermost surfaces of the wafers 28 in this embodiment, since they extend below the lower structure of the elevator 24) is positioned above both tank 22 and the uppermost surface of transfer robot 26. The transfer robot 26 then moves horizontally, in either direction, so that no portion of robot 26 is positioned so that it can interfere with the vertical movement of elevator 24 along guide track 42.

Elevator 24 with its set of wafers 28 then moves vertically downward along guide track 42 toward processing tank 22, until wafers 28 are positioned within tank 22 to allow any desired processing operations to take place. In particular, the elevator 24 preferably positions the wafers 28 so that they can be completely immersed in a processing fluid that is either present in the tank when the wafers are lowered therein, or added to the tank after the wafers are present. The wafers 28 may then be subjected to a single processing step or multiple processing steps within processing tank 22, such as, for example, chemical etching, rinsing, and/or drying.

When the processing of wafers 28 is complete, elevator 24 moves vertically upward along guide track 42 until the lowermost surface of elevator 24 is high enough that it will not interfere with the horizontal movement of transfer robot 26 along guide track 50. Transfer robot 26 then moves horizontally until it is again positioned directly below the elevator 24 and above processing tank 22. To transfer wafers 28 from elevator 24 to transfer robot 26, elevator 24 moves vertically downward along guide track 42 until the bottom surfaces of wafers 28 come in contact with support bars 60, 62. Elevator 24 continues to move vertically downward as rods 44, 46 pass outside the outermost edges of support bars 62, thereby essentially depositing the wafers 28 back onto support bars 60, 62 of elevator 24. In order to allow transfer robot 26 to freely move horizontally along guide track 50, elevator 24 moves vertically downward until the lowermost surface of transfer robot 26 can pass by the uppermost surface of elevator 24. Transfer robot 26 then can move horizontally to transport wafers 28 to another location.

Although the process described above uses the same transfer robot 26 to transport the wafers 28 both to and from elevator 24, one transfer robot may be used for bringing wafers to the elevator 24 and a different transfer robot may be used to transport wafers from the elevator 24 to a different location. If more than one transfer robot is used, the wafer handling system should be configured so that the movements of the transfer robots do not interfere with one another. This may be accomplished, for example, with a wafer handling system including multiple guide tracks that are spaced from one another to allow free horizontal movement of the multiple transfer robots.

Elevator 24 can move vertically or in the y-direction and transfer robot 26 can move horizontally or in the x-direction along their respective guide tracks illustrated in FIG. 2. It is also contemplated, however, that the elevator 24 and robot 26 can also be moved in up to two additional axes of motion to provide an expanded range of motion (i.e., the x, y, and/or z-directions) for these components. For example, elevator 24 may be movable to the z-direction (i.e., perpendicular to the plane of the wafers 28) to provide the necessary clearance for a transfer robot to move past the elevator 24 without obstruction. In addition, any or all of bars 60, 62 or support rods 44, 46 may be movable relative to their respective support plates to provide clearance for the other components or wafers being moved, as is described for example in U.S. Provisional Patent Application Ser. No. 60/338,044, filed Nov. 13, 2001, commonly owned by the assignee of the present invention, from which the present application claims priority and which is incorporated by reference in its entirety.

As discussed above, elevator 24 includes first and second wafer support rods 44, 46 that extend from the front face of support plate 30, and each of these support rods 44, 46 preferably includes an upper support row 48 and a lower support row 49. Numerous variations of the support rows may be used in the transfer and processing operations of the present invention. For example, the support rows 48, 49 on a single support rod may be identical to each other and aligned so that a wafer or other planar object will rest between them. For another example, the support rows 48, 49 on a single support rod (e.g., support rod 44) may be different from each other, but may be mirror images of the support rows on another support rod (e.g., support rod 46). For another example, the elevator 24 may include separate support structures for each of the upper support row and lower support row, rather than having both support rows on a single support rod, as previously described. Thus, the descriptions contained herein directed to elevators having support rods with multiple support rows are equally applicable to elevators having a separate support structure for each individual support row. A variety of combinations of similar or identical support rows among the support rods are possible, depending on the particular process and wafers being used.

Figure 6:
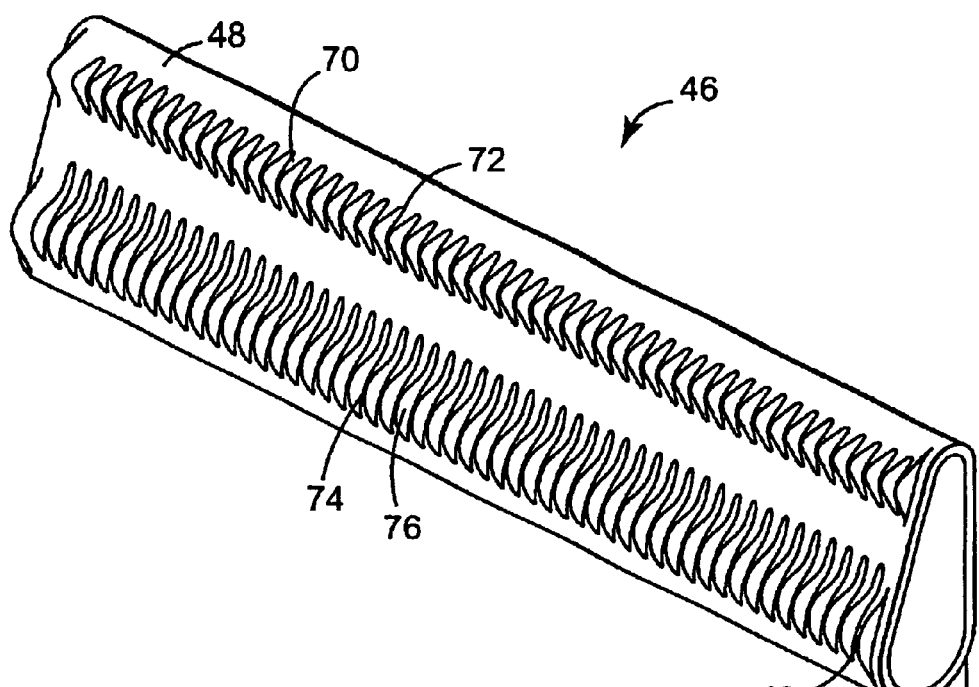
FIG. 6 is a perspective view of a wafer support rod having one embodiment of rows of teeth defining a plurality of notches in accordance with the present invention.

While the support rows may be configured in a variety of ways, in order to allow for even processing and drying of the wafer surfaces, it is often desirable to minimize the amount of fluid that can become entrapped between the wafer surface that is contacted by any type of holding device or apparatus. FIG. 6 illustrates a perspective view of one embodiment of a support rod 46 that can extend from an elevator device, such as from the support plate 30 of elevator 24. Alternatively, support rod 46 may be part of a cassette structure that preferably, but not necessarily, can have a second support rod (not shown) that is spaced from support rod 46 by at least one spacing device by a distance that corresponds with the diameter of a set of wafers to be supported thereon. As shown, the upper support row 48 comprises a plurality of V-shaped teeth 70 with generally V-shaped grooves or notches 72 between each pair of adjacent teeth 70. The lower support row 49 similarly comprises a plurality of V-shaped teeth 74 with generally V-shaped grooves or notches 76 between each pair of adjacent teeth 74. Support rod 46 may be assembled in any number of ways, such as, for example, providing a sleeve with machined teeth having internal support rods for rigidity of the structure.

Figure 17:
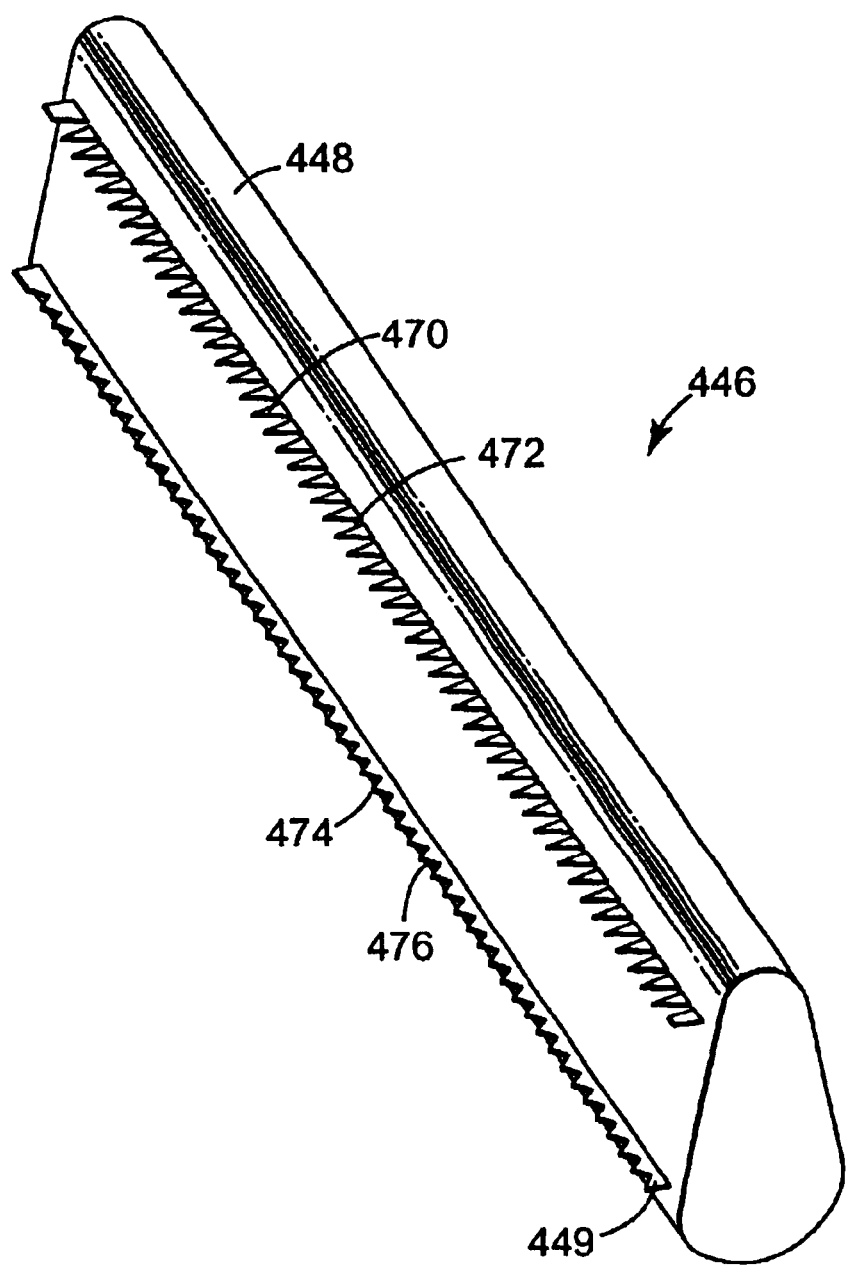
FIG. 17 is a perspective view of a wafer support rod having another embodiment of rows of teeth defining a plurality of notches in accordance with the present invention.

To desirably minimize the amount of fluid entrapment between wafers and supporting teeth within a notch, FIG. 17 illustrates another preferred embodiment of a support rod 446 that extends from the elevator device, such from support plate 30 of elevator 24. As shown, an upper support row 448 comprises a plurality of thin, V-shaped teeth 470 with generally V-shaped grooves or notches 472 between each pair of adjacent teeth 470. A lower support row 449 similarly comprises a plurality of thin V-shaped teeth 474 with generally V-shaped grooves or notches 476 between each pair of teeth 474. The teeth 470, 474 of this embodiment are designed to be as thin as possible, and as shown, are much thinner than the teeth of the embodiment of FIG. 6. In other words, the thickness of the teeth is preferably minimized, where the minimum thickness of the teeth is functionally limited by the ability of those teeth to provide sufficient structural support for wafers in the various processing environments to which the teeth will be subjected. It is understood that both of the support rows may comprise thin teeth, with both the upper and lower support rows having teeth of the same thickness, or that upper support row may have teeth of a different thickness than the teeth of the lower support row.

When thinner teeth are used for supporting a set of wafers, the teeth should be sufficiently strong that they will not bend or deform from the weight and pressure of wafers being held by the elevator, thereby providing adequate structural support for the wafers. In one example, teeth 470, 474 are preferably less than approximately 10 mm wide, are more preferably less than approximately 3 mm wide, and are even more preferably approximately 1 mm wide to minimize fluid entrapment between the wafer and the notch in which it is being supported. The teeth may be more or less than 1 mm wide, depending on many factors, such as the material from which the teeth are made and the other dimensions of the teeth. In addition, it is important that the material from which the teeth are made is selected to be consistently stable, even when subjected to different processing fluids and temperature changes.

It is further understood that the thin teeth of FIG. 17 may be basically formed as a relatively flat plate or strip having a plurality of formed notches and teeth, or the teeth may have a wide variety of other configurations or shapes, all of which are preferably designed to minimize fluid entrapment between wafers and the notches in which they are held. For example, the upper and lower support rows 448, 449 may comprise a single strip of material including teeth and grooves, or may instead consist of a set of individual teeth spaced to provide a groove between adjacent teeth along the length of a support rod. For another example, the notches may be more conical in shape, or may have more rounded surfaces than shown. The notches may instead have both flat and angled portions. In addition, it is understood that while it is preferable that all of the adjacent teeth and notches with a row of notches are identical to each other, the notches and teeth in a particular row may be different from each other, as desired.

Figure 7:
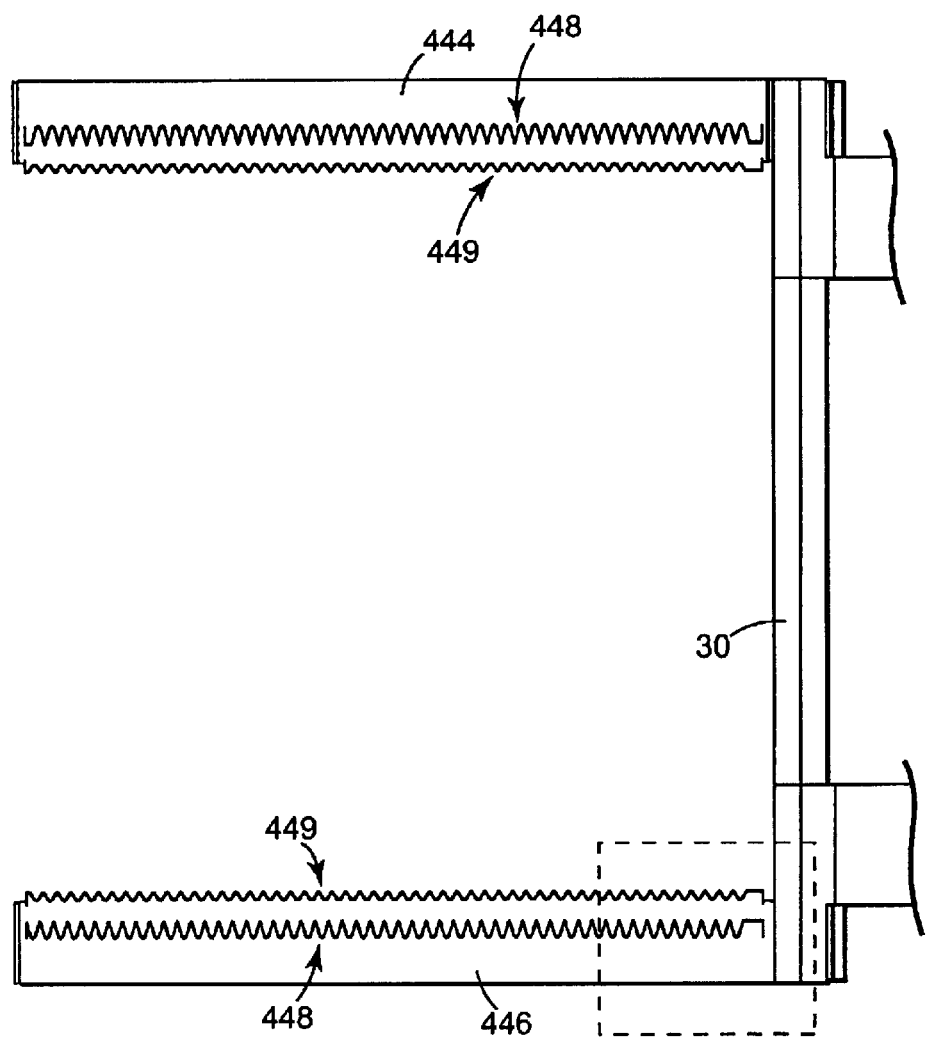
FIG. 7 is a top view of a portion of an elevator in accordance with the present invention.
Figure 8:
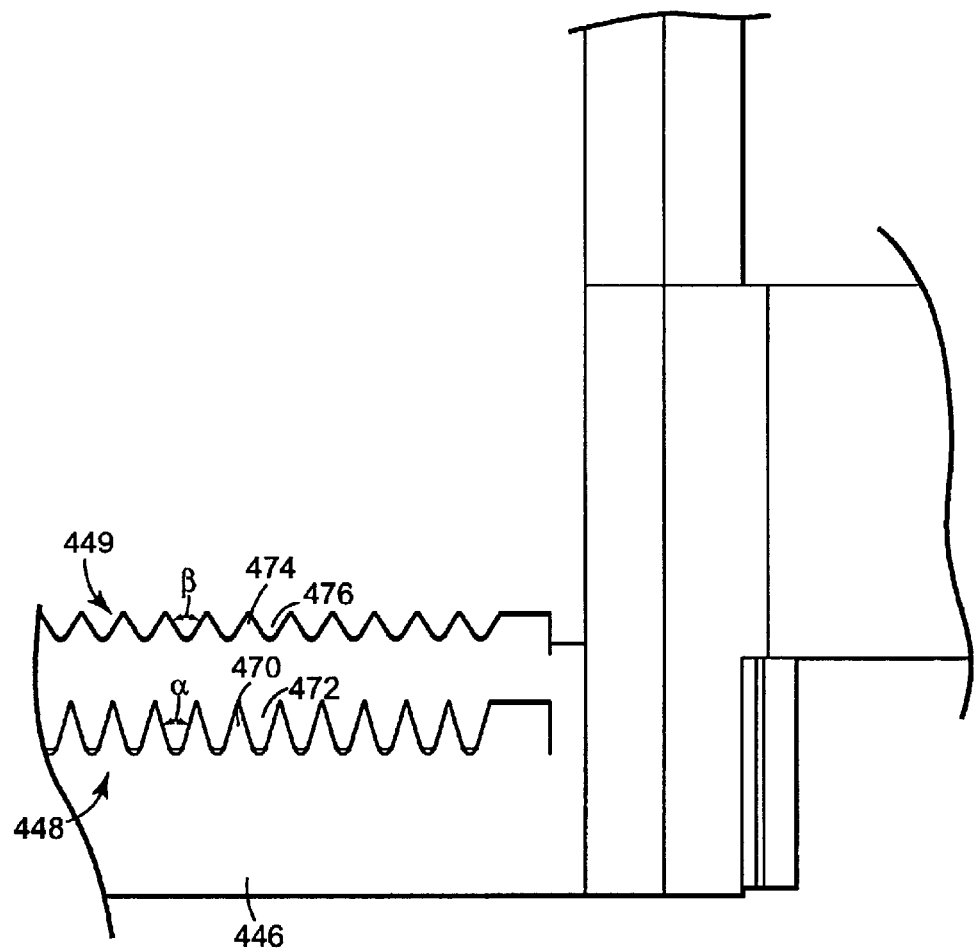
FIG. 8 is a enlarged top view of the portion of the elevator of FIG. 7 surrounded by dashed lines, including a portion of one wafer support rod.

FIG. 7 is a top view of a portion of the elevator 24 as discussed above with support rods 446 and 448 (of the type illustrated in FIG. 17) extending from support plate 30. In this view, the upper support row 448 and lower support row 449 of both wafer support rods and 444, 446 can more clearly be seen, and FIG. 8 is an enlarged view of the portion of wafer support rod 446 surrounded by dashed lines in FIG. 7. In this view, while support rod 446 is shown as being connected to a base plate 30 of an elevator, the support rod may instead be a portion of a cassette used for holding and transporting wafers, as described above. In either case, the teeth 470 are preferably generally V-shaped with a slightly rounded portion at the tip of each tooth 470. However, each tooth 470 may instead have a sharp portion at its tip, may have a squared tip, may have one or more curvilinear surfaces, or may be otherwise configured, such as having one edge that is generally perpendicular to the extension direction of the support rod 446 and another edge that is angled relative to this extension direction. In other words, the exact dimensions and configuration of the teeth and notches may take a wide variety of forms that are equally functional in accordance with the present invention.

The teeth 470 of upper support row 448 are preferably evenly spaced from each other, with a notch or groove 472 between each pair of adjacent teeth 470. Each notch 472 is preferably generally V-shaped with a slightly rounded portion at the base of the notch, but as explained above relative to the design of the teeth 470, the notches 472 may also take a wide variety of forms that are equally functional in accordance with the present invention. For example, the base of the notches 472 may be more angular, more squared, or differently shaped. In any case, the design of the teeth 470 and corresponding notches 472 should be selected to be compatible for holding wafers. Teeth 474 and corresponding notches 476 of lower support row 449 are preferably selected and designed with the same considerations as those described above relative to the teeth 470 and notches 472 of upper support row 448.

In one preferred embodiment, each notch 472 has an angle $\alpha$ and each notch 476 has an angle $\beta$ as shown in FIG. 8. While these angles $\alpha$ and $\beta$ may be the same as each other, various advantages have been found by making these angles different from each other to adequately hold wafers while also minimizing fluid entrapment between wafers and adjacent holding surfaces. In particular, making a notch angle larger can minimize the entrapment of fluid (i.e., allow for more free flow of fluid) between a wafer and the notch in which it is resting, while making a notch angle smaller can provide better wafer holding capabilities within the notches, as illustrated in FIGS. 9 and 10.

Figure 9:
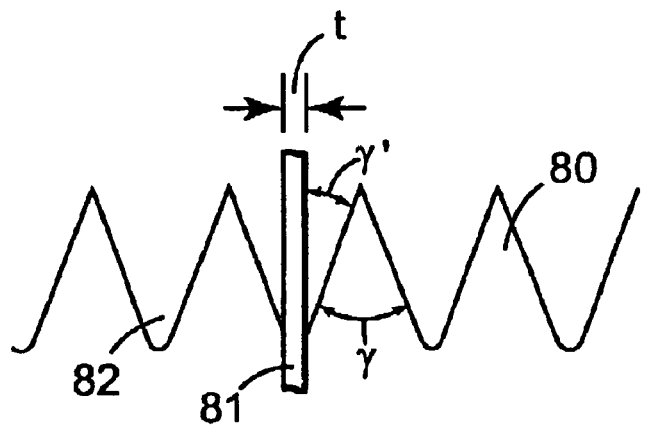
FIG. 9 is a schematic side view of several teeth of an upper support row of a wafer support rod, including a single wafer in a notch between two adjacent teeth.
Figure 10:
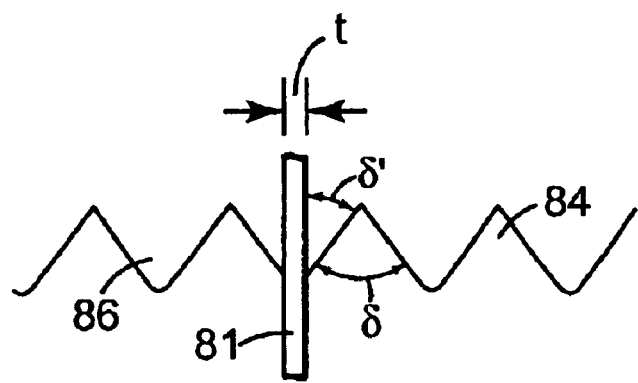
FIG. 10 is a schematic side view of several teeth of a lower support row of a wafer support rod, including a single wafer in a notch between two adjacent teeth.

In particular, FIG. 9 illustrates multiple teeth 80, each having a tooth angle $\gamma$. Because each of the teeth 80 is generally symmetric about the tip of the tooth and each preferably identical and has the same angle $\gamma$, basic geometry dictates that each of the corresponding notches 82 between a pair of teeth 80 has the same angle y between its surfaces. A portion of one wafer 81 having a thickness t is shown schematically as positioned within a notch 82, thereby generally dividing the notch into two portions, with one portion to the left of the wafer 81 and the other portion to the right of the wafer 81. When the wafer 81 is positioned so that it is in the middle of notch 82, as shown, the two portions on either side of wafer 81 each have an angle $\gamma'$ which may be roughly half the size of angle $\gamma$. Similarly, FIG. 10 illustrates multiple teeth 84, each having a tooth angle $\delta$. Because each of the teeth 84 is generally symmetric about the tip of the tooth and has the same angle $\delta$, basic geometry dictates that the corresponding notches 86 between each pair of teeth 84 has the same angle $\delta$ between its surfaces. A portion of one wafer 81 having a thickness t is shown schematically as positioned within a notch in 86, thereby generally dividing the notch into two portions. When the wafer 81 is positioned so that it is in the middle of notch 86, as shown, the two portions on either side of the wafer 81 each have an angle $\delta'$, which may be roughly half the size of angle $\delta$.

As illustrated, angle $\delta'$ is larger than angle $\gamma'$. This larger angle $\delta'$, which corresponds to a tooth and notch angle $\delta$, provides for a relatively large space between the wafer surfaces and adjacent notch surfaces, thereby allowing for a relatively free flow of fluid in this space. In contrast, the smaller angle $\gamma'$ between a wafer 81 and tooth 80 provides for a relatively small space between the wafer surfaces and adjacent notch surfaces. This smaller space for fluid flow provides a greater tendency for fluid entrapment within the space. However, this smaller angle and greater depth of notches 82 provides more flank surface for the wafer to contact and allows for the full tolerance of wafer diameter. Accordingly, a wafer does not contact the roots of the notches 82 and thus are less prone to fluid entrapment. The distance between the tips of adjacent upper teeth is the same as the distance between the tips of adjacent lower teeth to provide the same lead-in for robotic transfer of wafers.

One preferred embodiment of the present invention utilizes the advantages of both large and small tooth angles within a single support rod. With particular reference to support bar 446 of FIG. 17, teeth 470 of upper support row 448 have a smaller angle than the teeth 474 of lower support row 449, so that the upper teeth 470, which contact wafers closer to their centerline than the lower teeth 474 do. With these teeth 470 that are closer to the centerline of the wafers, gravity can assist in moving fluids away from the wafers space between the notch surfaces and the wafer, even though the space between the wafer and notch surfaces is relatively small. Moreover, the larger angle of the teeth 474 of lower support row 449 allows for a more free flow of fluids and therefore less fluid entrapment in areas that are further from the centerline of the wafers and the upper support row 448; however, gravity also assists in moving fluid away from the relatively larger space between the wafer and notch surfaces. In this way, the advantages of both large and small tooth angles can be used in a single component.

In one particular preferred embodiment, the angle $\alpha$ of notches 472 of the upper support row 448 is about 30 degrees and the corresponding angle $\beta$ of the notch 476 of the lower support row 449 is about 60 degrees. In this combination of tooth angles, the angle $\alpha$ may be greater or less than 30 degrees and the angle $\beta$ may be greater or less than 60 degrees, as long as the angle $\alpha$ is less than the angle $\beta$. However, this combination of tooth angles is considered to be only one example of many possible combinations of tooth angles that are within the scope of the present invention, where the particular angles are chosen to provide a desired combination of the benefits described above.

It is recognized that while the advantages achieved by the combination of teeth angles described above are often desirable, another possible combination of tooth angles is a support bar having an upper support row 448 having notches with an angle $\alpha$ that is greater than the angle $\beta$ of the notches of the lower support row 449. While the fluid flow will be different in this combination, the advantages of utilizing both smaller and larger angles may still be achieved. In addition, a particular support bar may have more than two support rows, where the various rows can include notch angles that are chosen to provide the advantages of small and large angles described above. Finally, a particular device, such as an elevator or cassette, may have multiple support bars spaced from each other, where the support bars may be mirror images of each other, or the multiple support bars may each include a different combination of notch angles, as desired.

Figure 11:
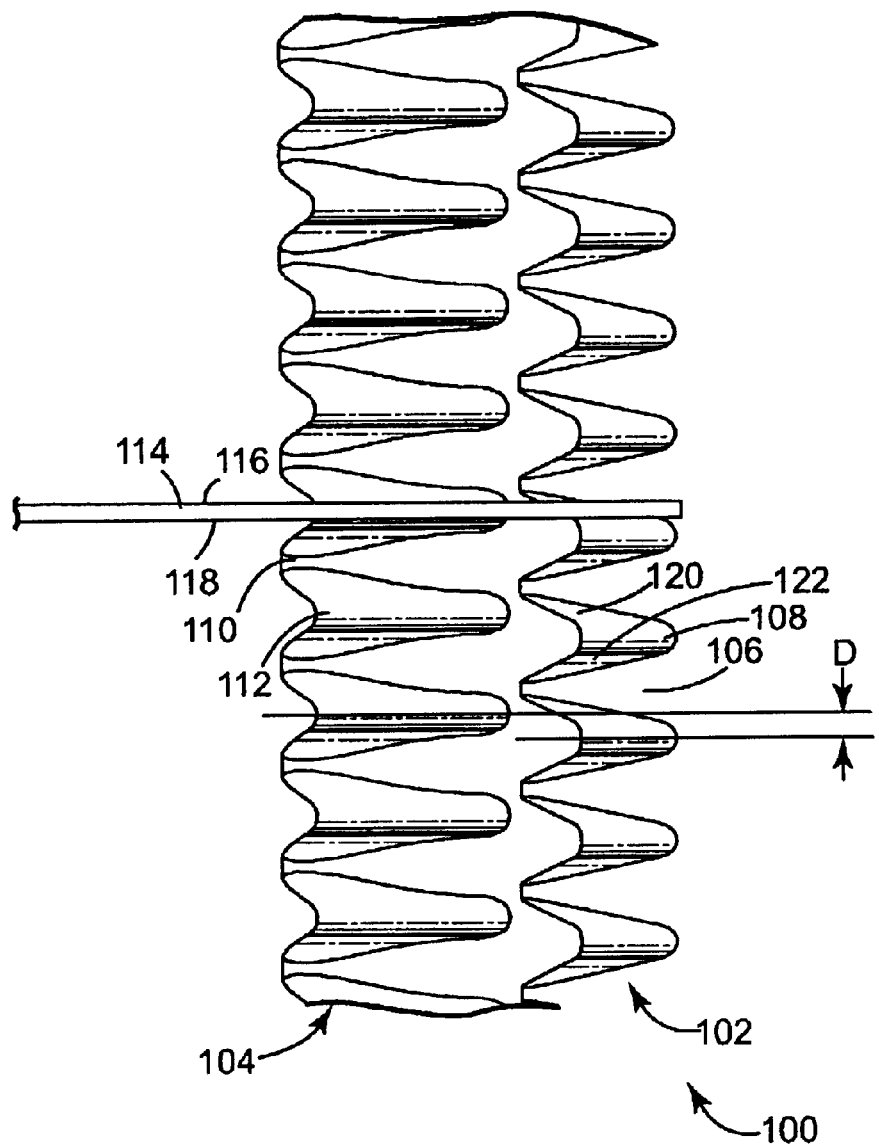
FIG. 11 is a top view of a portion of a support rod and two rows of teeth and notches that are offset relative to each other, in accordance with the present invention.

FIG. 11 illustrates another configuration of a portion of a wafer support bar 100 having an upper support row 102 and a lower support row 104 that is substantially parallel to support row 102. Upper support row 102 includes a plurality of teeth 106 spaced from each other by a plurality of notches 108. Lower support row 104 includes a plurality of teeth 110 spaced from each other by a plurality of notches 112. The teeth of this embodiment are of the wider type shown in FIG. 6; however, it is understood that the same principles described here apply similarly to a support bar having thinner teeth, such as those illustrated in FIG. 17. As illustrated, the teeth 106 of upper row 102 are offset from the teeth 110 of lower row 104 along the length of the support bar 100, and the notches 108 of upper row 102 are offset from the notches 112 of lower row 104 by a corresponding distance. The distance the two rows are offset from each other is shown in this embodiment as a distance D that is measured perpendicular to the support rows 102, 104 between the centerline of one of the notches 108 of the upper support row 102 and the centerline of one of the notches 112 of the lower support row 104.

The offset between the teeth and notches of the upper and lower support rows provides a wafer support arrangement on a support bar that is illustrated by a single wafer 114 positioned within notches 108, 112. The wafer has a first surface 116 and an opposing second surface 118. A portion of wafer 114 is positioned within the notch 112 so that the centerline of the wafer 114 and the centerline of the notch 112 are substantially aligned. However, the portion of wafer 114 positioned within notch 108 is offset such that the centerline of the wafer 114 is not aligned with the centerline of the notch 108. Instead, support rows 102, 104 are preferably offset enough that the first wafer surface 116 is pressed up against a rear flank surface 120 of notch 108, while second wafer surface 118 is essentially not in contact with any portion of notch 108, including a front flank surface 122.

Referring again to FIGS. 9 and 10, the configuration of thin teeth described relative to FIG. 17 can also desirably be utilized in the described offset tooth arrangement. In particular, when an upper row of thin teeth is offset from a lower row of thin teeth, each wafer would rest generally in the center of a notch of the lower row of teeth (as in FIG. 10), but would be pressed up against one of the flank surfaces or notch sides of the upper row of teeth, in contrast to the position of wafer 81 shown in notch 82 of FIG. 9.

Figure 12:
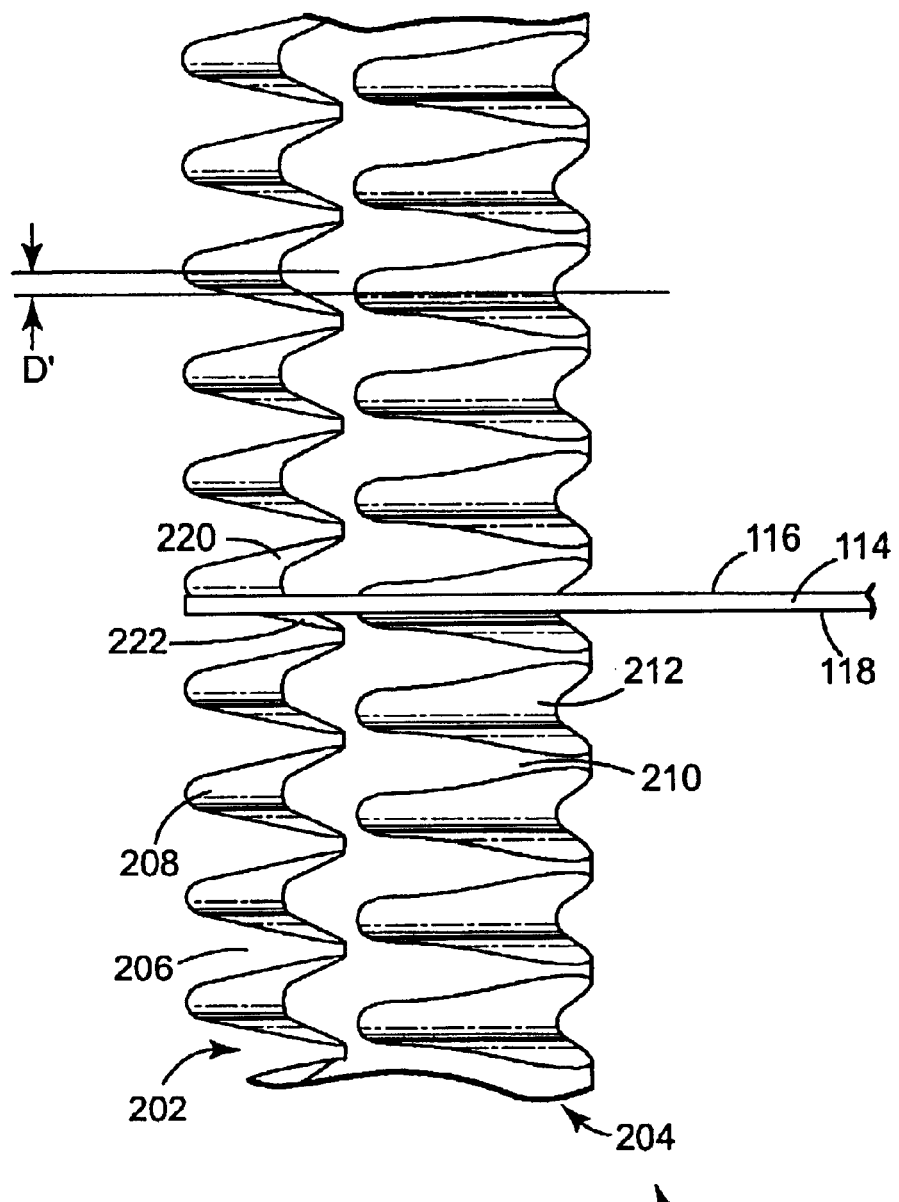
FIG. 12 is a top view of a portion of another support rod having two rows of teeth and notches that are offset relative to each other in a direction opposite to the offset direction of the teeth and notches of FIG. 11, in accordance with the present invention.

FIG. 12 illustrates one preferred configuration of another support bar 200 that may be spaced from support bar 100 of FIG. 11 in a device such as an elevator or cassette. The support bar 200 has an upper support row 202 and a lower support row 204 that is substantially parallel to support row 202. Upper support row 202 includes a plurality of teeth 206 spaced from each other by a plurality of notches 208. Lower support row 204 includes a plurality of teeth 210 spaced from each other by a plurality of notches 212. As with support bar 100, the teeth of this support bar 200 are of the wider type shown in FIG. 6; however, the same principles described here apply similarly to a support bar having thinner teeth, such as those illustrated in FIG. 17. As illustrated, the teeth 206 of upper row 202 are offset from the teeth 210 of lower row 204 along the length of the support bar 200, and the notches 208 of upper row 202 are offset from the notches 212 of lower row 204 by a corresponding distance. The distance the two rows are offset from each other is shown in this embodiment as a distance D' that is measured perpendicular to support rows 202, 204 between the centerline of one of the notches 208 of the upper support row 202 and the centerline of one of the notches 212 of the lower support row 204. While this arrangement is similar to that of support bar 100, the upper row 202 and lower row 204 of support bar 200 are offset in the opposite direction of the offset direction of support bar 100. Thus, the second surface 118 of wafer 114 positioned within a notch 208 is pressed up against a front flank surface 222 of notch 208 while the first wafer surface 116 is essentially not in contact with any portion of notch 208, including a rear flank surface 220.

Figure 13:
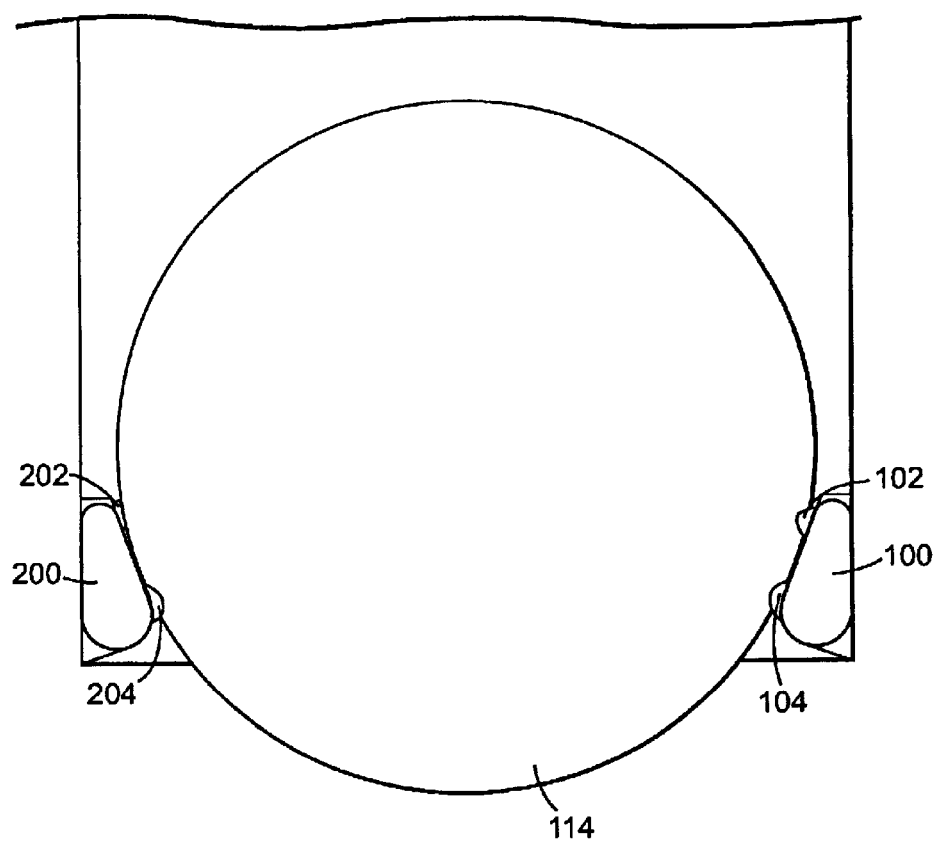
FIG. 13 is a front view of a portion of an elevator having a wafer positioned between a pair of support rods.

A front view of an elevator or cassette configuration including the two support bars 100, 200 is illustrated in FIG. 13. In this embodiment of the present invention, support bar 100 is positioned to the right of support bar 200, and the support bars 100, 200 are substantially parallel to each other and spaced from each other by a distance that corresponds to a particular wafer diameter. Preferably, the notches 112 of lower support row 104 and the notches 212 of lower support row 204 are substantially aligned with each other along the length of support bars 100, 200. In this way, the notches 108 of the upper row 102 and notches 208 of upper row 202 are offset in opposite directions from each other. Thus, a wafer being supported within the notches of all four support rows 102, 104, 202, 204, would rest generally within the center of the notches of the lower support rows, but would have a torsional force on the wafer due to opposing forces being put on opposite sides of the wafer by the offset teeth of the upper support rows. Again referring to FIGS. 11 and 12, wafer surface 116 will be pressed against a rear notch flank surface 120 at the same time that the opposite wafer surface 118 is pressed against a front notch flank surface 222. These opposite forces on the opposing edges of the wafer tend to "lock" the wafer in place due to the torsional force exerted thereon. In order to put equal forces on both sides of the wafer, the offset distance D between the rows of teeth of support bar 100 and the offset distance D' between the rows of teeth of support bar 200 should be the same or nearly the same.

One particular configuration of elevator having two support bars was designed and assembled to accommodate a batch of up to 52 wafers that measure 300 mm in diameter. Each of the support bars has an upper row of teeth and a lower row of teeth, where the top and bottom rows of teeth were spaced from each other by approximately 1.25 inches in the vertical direction. The support bar was constructed of a sleeve of a fluoropolymer material supported by rigid metal bars extending along the length of the support bar. The teeth were machined into the sleeve of fluoropolymer material. The amount of offset between the top and bottom rows of teeth of each of the support bars was approximately 0.050 inches, where the offset direction was toward the base plate for one support bar and away from the base plate for the other support bar. These opposite offsets thereby put torsion in the plane of each wafer to thereby hold it in a secure and stable position between the teeth. Contact between the upper rows of teeth and the wafer was only along the flanks of the notches, with one side of the wafer contacting a front notch flank and the other side of the wafer contacting a rear notch flank. Since the support bars were only attached at one end to a base plate, deflection of the bars was mitigated by the use of the rigid metal rods attached to a metal base plate.

In another embodiment of the present invention, one support bar having offset rows of notches is paired within a single device with a support bar having notches that are aligned between its upper and lower support rows. In this case, the lower notches of both support bars are also substantially aligned with each other so that one top row of teeth and both bottom rows of teeth are essentially in the same plane. Because only one support bar is utilizing offset notches, only one side of each wafer will be pressing against a notch flank. In this arrangement, the wafers may tend to tilt on the offset side at a vertical angle that corresponds to the amount of the offset.

In yet another embodiment of the present invention, both support bars have rows of notches that are offset between the upper and lower support rows in the same direction. In this case, both the left and right sides of each wafer will press against the same notch flank of the notch in which it is being supported (e.g., both sides of the wafer can be pressing against a front notch flank), and the wafer may tend to tilt in the direction of the offset.

The various advantages of different teeth angles and arrangements described above can be combined within a single structure or device to achieve even greater advantages than those accomplished when using any of the features alone. The elevator 24 of FIG. 3, for example, may preferably include a first support bar (such as support bar 44) having an upper support row that is offset from a lower support row along the length of the support bar. In addition, the upper support row includes a plurality of teeth having a first angle and the bottom support row includes a plurality of teeth having a second angle that is larger than the first angle. The elevator preferably further comprises a second support bar (such as support bar 46) spaced from the first support bar and having an upper support row that is offset from a lower support row in the opposite direction than the rows are offset from each other on the first support bar. More preferably, the teeth of the upper support row have an angle of about 30 degrees and the teeth of the lower support row have an angle of about 60 degrees. In this way, a set of wafers being held by this elevator will advantageously be securely held in place by the offset teeth, where the offset teeth provide the additional advantage of being able to hold wafers securely near the wafer centerlines, thereby minimizing obstruction of megasonic energy in typical megasonic cleaning processes. Combining this advantage with the benefits of having the upper row with smaller angled teeth to provide stability and the lower row with larger angled teeth to allow better fluid flow can allow for better wafer processing.

Many additional variations of the elevator structure are contemplated and considered to be within the scope of this invention, depending on the particular processing steps that will be performed on the wafer. For example, the angle of the teeth may vary to provide different holding capabilities and fluid flow, and the direction and amount of offset may vary depending on the stability desired and the dimensions of the wafers. In some cases, it may further be desirable for the two wafer support bars of the elevator to be mirror images of each other, but in other situations, it may be desirable for each of the support bars to have different teeth structures and angles relative to the other support bar so that opposite sides of the wafer are being held differently from each other. It may also be desirable for a particular elevator to have more than two support bars. Moreover, many of the concepts discussed above, particularly with regard to teeth angles and positions, could easily be used in a transfer robot or other device to provide the various advantages described relative to tooth angles and offset teeth.

While a particular elevator may include all or some of the features previously described, it is advantageous in any of these embodiments for the support bars that hold the wafers to be dimensionally stable in order to maintain relatively tight tolerances between the components to keep the wafers from being damaged. This can be particularly difficult when a device, such as an elevator device of the present invention, includes relatively long bars that are attached to a base plate at only one end. Support bars may be attached to the base plate of the elevator using various conventional methods, such as mechanical fasteners, welding, and the like. Alternatively, FIGS. 14–16 illustrate a construction of the present invention for securing support rods that extend in a generally perpendicular direction from a base plate.

Initially referring to FIG. 14, a cross-sectional view of one preferred embodiment of an elevator 300 is illustrated, which comprises a support plate 302 from which a mechanically rigid support beam 304 extends. Support beam 304 is preferably mounted to be perpendicular to a first side 306 of support plate 302, with a first end 308 of support beam 304 connected to first side 306 of support plate 302 with mechanical fasteners, and a second end 310 of support beam 304 connected to bracket 312 by mechanical fasteners. The mechanical fasteners used may include any appropriately sized screws, cap screws, bolts, or the like that can securely attach the support beam 304 to support plate 302. Alternatively, welding or other attachment methods may be used. Bracket 312 is preferably designed so that it can either cooperate directly with a guide track (not shown) on which the elevator may travel, or be connected to another component that cooperates with a guide track.

Elevator 300 further comprises a wafer support bar 314 that extends in generally perpendicular direction from a second side 316 of support plate 302. Support bar 314 includes a first end 318 that attaches to the support plate 302 (shown enlarged in FIG. 16), and a second, distal end 320 spaced from the first end 318 (shown enlarged in FIG. 15). In accordance with the present invention, the wafer support bar 314 further includes an upper and lower row of teeth (not shown) for holding wafers, where these teeth are machined into a sleeve of fluoropolymer material. Because this fluoropolymer material is prone to expansion and contraction with changing operating conditions (e.g., temperature), the support bar 314 further includes an upper rod 322 and a lower rod 324, which are both preferably made of a relatively rigid material, such as metal. The size and material of the rods 322, 324 should be selected to provide the necessary strength and rigidity for support bar 314 so that it does not deflect or deform substantially when wafers or other components are being supported thereon.

The teeth machined into the sleeve of fluoropolymer material are not visible, however, the portions of the sleeve that are above and below the rods 322, 324 can be seen in FIGS. 14–16. In particular, the sleeve includes a top sleeve portion 326 above the upper rod 322, a bottom sleeve portion 328 below the lower rod 324, and a middle sleeve portion 330 between the two rods 322, 324. In order to secure the sleeve, a first retaining plate 340, which is preferably a metal plate, is positioned vertically between the two rods 322, 324 and positioned horizontally between the end of the middle sleeve portion 330 and a rigid end cap 342. At the opposite end of the support bar 314, a second retaining plate 344, which is also preferably a metal plate, is similarly positioned between the rods 322, 324.

One preferred method of assembling the components of elevator 300 may be accomplished through several steps in order to achieve the advantages described above. In particular, the sleeve of fluoropolymer material is first fusion-welded to mating bosses on a perfluoroalkoxy (PFA) plate which covers the second side of the support plate 302. Fusion-welding of a fluoropolymer (e.g., PFA or polyvinylidine fluoride (PVDF)) involves the use of a non-contact heating plate that is held in close proximity to the sleeve and the support plate 302 to which it is to be welded. When the material of each of these components reach the molten state, they are mechanically pressed together with a small force, while guides help to keep the components properly aligned. The molten materials diffuse on a molecular level from one side to the other so that when the materials cool and recrystalize, the joint will exhibit identical mechanical properties (e.g., load vs. elongation, fatigue endurance, thermal expansion, etc.) to the materials before they were bonded together. This process creates a "fusion bond" between the materials, which is one of the strongest types of bonds available for thermoplastics. Other methods of fusion bonding can also be used, such as spin-welding or vibration-welding, as these terms are commonly understood in the art.

This assembly is then fitted onto a previously assembled metal structure including the support plate 302, the upper rod 322, the lower rod 324, a rigid end cap 342, the support beam 304, and cap screws that secure the various components. Retaining plates 340, 342 on opposite ends of support bar 314 are then positioned as shown in FIGS. 14–16. The PFA plate is temporarily clamped against support plate 302. Set screws 348, 350 are then inserted in each end and tightened to gently press the retaining plates 340, 342 against the bottom of the recess at each end of the support beam 304. The set screws 348, 350 can be adjusted to move the sleeve of fluropolymer material toward or away from support plate 302 until it is at its desired location relative to the support plate 302. While not visible in these Figures, the assembly 300 preferably includes another support beam spaced from support beam 304 and extending from the support plate 302. Thus, the same method of assembling and attaching this support beam relative to support plate is preferably used, where this support beam is also adjusted relative to the support beam 304 and the support plate 302 through the adjustment of set screws to position the beam in its desired location, thereby providing the desired alignment or offset between teeth on the two support beams, in accordance with the present invention. Once the components are in their desired locations, the sets screws 348, 350 are preferably tack-welded to prevent any undesired movement of the screws after the assembly is properly adjusted.

The present invention has now been described with reference to several embodiments thereof. The entire disclosure of any patent or patent application identified herein is hereby incorporated by reference. The foregoing detailed description and examples have been given for clarity of understanding only. No unnecessary limitations are to be understood therefrom. It will be apparent to those skilled in the art that many changes can be made in the embodiments described without departing from the scope of the invention. For instance, the variations in tooth structures and configurations described for use in an elevator or cassette may also be used in a transfer robot or tank-to-tank robot or in a device that is performing a different function than moving or immersing wafers. Thus, the scope of the present invention should not be limited to the structures described herein, but only by the structures described by the language of the claims and the equivalents of those structures.

What is claimed is:

1. A microelectronic substrate handling device for immersion processing and for supporting and transfer of at least one generally planar microelectronic substrate, the handling device comprising a movable support member and first and second support structures extending from a surface of the movable support member and operatively spaced from each other to support at least one microelectronic substrate between the first and second support structures, the second support structure comprising a series of teeth defining a series of notches extending along a length of the second support structure and the first support structure comprising:

a series of upper teeth extending along a length of the first support structure and defining a series of upper notches opening toward the series of notches of the second support structure for receiving an edge of a microelectronic substrate when supported by the first and second support structures, the upper teeth having substrate engaging surfaces angled with respect to the direction of extension of the upper teeth for engaging and urging substrates in a direction of the series of upper teeth; and a series of lower teeth extending along a length of the first support structure and defining a series of lower notches opening toward the second support structure for receiving an edge of a microelectronic substrate when supported by the first and second support structures, wherein the upper and lower notches of the first support structure are offset from each other by a first predetermined offset distance so that an edge of a generally planar microelectronic substrate can fit similarly within notches of the second support structure and the lower teeth of the first support structure but differently within the upper notches of the first support structure when supported between the first and second support structures.

2. The microelectronic substrate handling device of claim 1, wherein the second support structure comprises:

a series of upper teeth defining a series of upper notches extending along a length of the second support structure, each of the upper notches opening toward the first support structure for receiving an edge of a microelectronic substrate when supported by the first and second support structures; and a series of lower teeth defining a series of lower notches extending along a length of the second support structure, each of the lower notches opening toward the first support structure for receiving an edge of a microelectronic substrate when supported byte first and second support structures.

3. The microelectronic substrate handling device of claim 2, wherein the upper and lower notches are offset from each other by a second predetermined offset distance so that an edge of a microelectronic substrate will fit differently within the upper and lower notches of the second support structure when supported between the first and second support structures.

4. The microelectronic substrate handling device of claim 2, wherein the upper and lower notches are aligned with each other.

5. The microelectronic substrate handling device of claim 4, wherein each of the lower notches of the second support structure is farther aligned with one of the lower notches of the first support structure.

6. The microelectronic substrate handling device of claim 4, wherein each of the upper notches of the second support structure is further aligned with one of the upper notches of the first support structure.

7. The microelectronic substrate handling device of claim 1, wherein to first support structure further comprises a single support bar.

8. The microelectronic substrate handling device of claim 7, wherein the second support structure further comprises a single support bar.

9. The microelectronic sub state handling device of claim 3, wherein the upper notches of the first support structure are offset from the lower notches of the first support structure in a first offset direction and upper notches of the second support structure are offset from the lower notches of the second support structure in a second offset direction, wherein the first offset direction is opposite from the second offset direction.

10. (Original) The microelectronic substrate handling device of claim 1, wherein each of the notches of to upper series of notches is identical to each adjacent notch and each of the notches of the lower series of notches is identical to each adjacent notch.

11. The microelectronic substrate handling device of claim 3, wherein each of the notches of the upper series of notches of the second support structure is identical to each adjacent notch and each of the notches of the lower series of notches of the second support structure is identical to each adjacent notch.

12. The microelectronic substrate handling device of claim 1, wherein each of the notches of the series of upper notches has an upper notch angle measured in the direction of the length of the first support structure and each of the notches of the series of lower notches has a lower notch angle measured in the direction of the length of the first support structure, wherein the upper notch angle of each of the upper notches is different from the lower notch angle of each of the lower notches.

13. The microelectronic substrate handling device of claim 12, wherein the upper notch angle is smaller than the lower notch angle.

14. The microelectronic substrate handling device of claim 13, wherein the upper notch angle is shoot 30 degrees and the lower notch angle is about 60 degrees.

15. The microelectronic substrate handling device of claim 1, wherein the at least one microelectronic substrate is a set of semiconductor wafers, each having a major diameter, wherein the first and second support structures are spaced flout each other to operatively support the set of semiconductor wafers.

16. The microelectronic handling device of claim 1, wherein at least one of the series of upper teeth and the series of lower teeth comprises a series of teeth that are minimized in thickness to minimize fluid entrapment between the upper and lower teeth and the microelectronic substrate when supported between the first and second support structures, while providing sufficient structural support for the microelectronic substrate.

17. The microelectronic handling device of claim 16, wherein each of the teeth of the upper and lower series of teeth is less than about 10 mm thick.

18. The microelectronic handling device of claim 16, wherein each of the teeth of the upper and lower series of teeth is approximately 1 mm thick.

19. A handling system for immersion processing of a set of spaced microelectronic substrate, comprising:
a substrate processing tank;
an elevator for lowering, holding, and raising a set of spaced microelectronic substrates into and out of the tank, the elevator comprising a base plate, first and second substrate support bars extending from a first surface of the base plate, wherein the first support bar has an inner surface including a first series of notches that faces an inner surface including a second series of notches of the second support bar for positioning a set of spaced microelectronic substrates and wherein the inner surfaces of the first and second support bars are spaced from each other by a first distance; and an elevating mechanism for lowering, holding, and raising a set of microelectronic substrates to be held byte first and second substrate support bars into and out of to tank; and
a transfer robot for transferring a set of microelectronic substrates to and from the tank, the transfer robot comprising a base plate, first and second substrate support structures extending from a first surface of the base plate, and a robot conveyance mechanism for moving the transfer robot from a first position for transfer of a set of microelectronic substrates to the elevator to a second position for transporting the substrates to another location, wherein the first and second support structures have inner and outer surfaces, the inner surfaces of the support structures facing each other and the outer surfaces of the support structures being spaced from each other by a second distance;
wherein the first distance between the inner surfaces of the first and second support bars of the elevator is larger than the second distance between the outer surfaces of the first and second support structures of the transfer robot.

20. The handling system of claim 19, wherein the set of microelectronic substrates is a set of semiconductor wafers.

21. A method of immersion processing a set of spaced microelectronic substrates in a processing tank, comprising the steps of:
vertically positioning an elevator above a processing tank and below a horizontally extending guide rail, the elevator comprising a base plate, and first and second substrate support bars extending from a first surface of the base plate for supporting and positioning a set of spaced microelectronic substrates;
providing a set of substrates to a transfer robot, the robot comprising a base plate, and first and second substrate support structures extending from a first surface of the base plate, and wherein the set of substrates are positioned the first end second substrate support structures;
moving the transfer robot along the guide rail until it is positioned above the processing tank and above the elevator;
lifting the elevator along a guide track until the support bars of the elevator pass on the outside of the support structures of the transfer robot and contact the set of substrates;
lifting the elevator further until the elevator is completely above the transfer robot, thereby transferring the set of substrates from the support structures of the transfer robot to the support bars of the elevator;
moving the transfer robot along tho transfer robot guide rail until it not below any part of the elevator;
conveying the elevator to position the set of substrates in the processing tank.

22. A microelectronic substrate handling device for immersion processing at least one microelectronic substrate, the device comprising a movable support member and first and second support structures extending from a surface of the support member and operatively spaced from each other to support at least one microelectronic substrate, the first support structure comprising:
a series of upper teeth extending along a length of the first support structure and defining a series of upper notches having a notch angle measured in the direction of the length of the first support structure, said teeth of said series of upper teeth having substrate engaging surfaces angled with respect to the direction of extension of the teeth for engaging and urging substrates in a direction of the series of teeth; and a series of lower teeth extending along a length of the first support structure and defining a series of lower notches having a notch angle measured in the direction of the length of the first support structure, wherein the notch angle of the upper notches is different than the notch angle of the lower notches.

23. The microelectronic substrate handling device of claim 22, wherein the tooth angle of each of the upper teeth is smaller than the tooth angle of each of the lower teeth.

24. A system for immersion processing of a set of spaced microelectronic substrates, comprising:

an immersion tank for substrate processing therein;

an elevator for lowering, holding, and raising a set of spaced microelectronic substrates having a predetermined diameter into and out of the tank, the elevator comprising a base plate, first and second substrate support bars extending from a first surface of the base plate, wherein the first support bar has an inner surface including a first series of notches that faces an inner surface including a second series of notches of the second support bar for positioning a set of spaced microelectronic substrates and wherein the inner surfaces of the first and second support bars are spaced from each other by a first predetermined distance that is less than the diameter of the substrates to be supported, the first predetermined distance being such that the first and second support bars will engage the substrates of predetermined diameter within about ten degrees below a horizontal centerline of a substrate of the predetermined diameter when supported by the first and second support bars, and an elevating mechanism for lowering, holding, and raising a set of microelectronic substrates to be held by the first and second substrate support bars into and out of the tank.

25. The system of claim 24, wherein the immersion tank comprises a megasonic processing tank.

26. The system of claim 24, wherein the immersion tank comprises a processing and drying tank.

* * * * *

UNITED STATES PATENT AND TRADEMARK OFFICE
CERTIFICATE OF CORRECTION

PATENT NO. : 6,845,779 B2
DATED : January 25, 2005
INVENTOR(S) : Tim W. Herbst et al.

Page 1 of 1

It is certified that error appears in the above-identified patent and that said Letters Patent is hereby corrected as shown below:

Column 20,
Line 45, delete "byte" and insert in place thereof -- by the --.
Line 59, delete "farther" and insert in place thereof -- further --.
Line 66, delete "to" and insert in place thereof -- the --.

Column 21,
Line 4, delete "sub state" and insert in place thereof -- substrate --.
Line 13, delete "to" and insert in place thereof -- the --.
Line 36, delete "shoot" and insert in place thereof -- about --.
Line 42, delete "flout" and insert in place thereof -- from --.
Line 59, delete "substrate" and insert in place thereof -- substrates --.

Column 22,
Line 6, delete "byte" and insert in place thereof -- by the --.
Line 7, delete "to" and insert in place thereof -- the --.
Line 43, delete "the first end" and insert in place thereof -- by the first and --.
Line 54, delete "tho" and insert in place thereof -- the --.

Signed and Sealed this

Fifth Day of July, 2005

JON W. DUDAS
*Director of the United States Patent and Trademark Office*